US012613293B2

(12) United States Patent
Romero

(10) Patent No.: US 12,613,293 B2
(45) Date of Patent: Apr. 28, 2026

(54) SENSOR WITH COMMON MODE REJECTION AND OFFSET CORRECTION

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 178 days.

(21) Appl. No.: 18/640,378

(22) Filed: Apr. 19, 2024

(65) Prior Publication Data

US 2025/0180671 A1 Jun. 5, 2025

Related U.S. Application Data

(63) Continuation-in-part of application No. 18/527,675, filed on Dec. 4, 2023, now Pat. No. 12,517,195.

(51) Int. Cl.
*G01R 33/00* (2006.01)
*G01R 33/09* (2006.01)

(52) U.S. Cl.
CPC ....... *G01R 33/0017* (2013.01); *G01R 33/098* (2013.01)

(58) Field of Classification Search
CPC .......................... G01R 33/098; G01R 33/017; G01R 33/0029; G01R 33/0035; G01R 33/0041; G01R 33/0094; G01R 33/09
See application file for complete search history.

(56) References Cited

U.S. PATENT DOCUMENTS

| | | | |
|---|---|---|---|
| 4,709,214 A | 11/1987 | Higgs | |
| 5,212,456 A | 5/1993 | Kovalcik et al. | |
| 5,594,173 A | 1/1997 | Frey et al. | |
| 5,694,038 A | 12/1997 | Moody | |
| 6,043,644 A | 3/2000 | de Coulon et al. | |
| 6,100,680 A | 8/2000 | Vig | |
| 6,690,155 B2 | 2/2004 | Vig | |

(Continued)

FOREIGN PATENT DOCUMENTS

| | | |
|---|---|---|
| EP | 1 797 496 B1 | 7/2009 |
| EP | 3 954 971 A1 | 2/2022 |

OTHER PUBLICATIONS

U.S. Appl. No. 18/354,709, filed Jul. 19, 2023, Hein, et al.

(Continued)

*Primary Examiner* — Alesa Allgood

(74) *Attorney, Agent, or Firm* — DALY, CROWLEY, MOFFORD & DURKEE, LLP

(57) ABSTRACT

A sensing bridge includes a first element type that is responsive to a magnetic field and a second element type that is not responsive to the magnetic field. The first element type can be a magnetoresistance element such as a TMR and the second element type can be a passive resistor. A switching matrix under control of a matrix controller is configured to change a total resistance of the sensing element by coupling or decoupling one or more dots of the TMR and/or passive resistor unit cells of the passive resistor to the sensing element. Test signal generation circuitry is configured to generate a common mode test magnetic field with which the common mode rejection ratio (CMRR) of a sensing bridge can be evaluated and corrected.

19 Claims, 14 Drawing Sheets

(56) References Cited

U.S. PATENT DOCUMENTS

| | | |
|---|---|---|
| 7,138,793 B1 | 11/2006 | Bailey |
| 7,259,545 B2 | 8/2007 | Stauth et al. |
| 7,518,354 B2 | 4/2009 | Stauth et al. |
| 7,605,647 B1 | 10/2009 | Romero et al. |
| 7,705,586 B2 | 4/2010 | van Zon et al. |
| 7,746,056 B2 | 6/2010 | Stauth et al. |
| 7,800,389 B2 | 9/2010 | Friedrich et al. |
| 7,923,996 B2 | 4/2011 | Doogue et al. |
| 8,030,918 B2 | 10/2011 | Doogue et al. |
| 8,269,491 B2 | 9/2012 | Cummings et al. |
| 8,350,563 B2 | 1/2013 | Haas et al. |
| 8,447,556 B2 | 5/2013 | Friedrich et al. |
| 8,542,010 B2 | 9/2013 | Cesaretti et al. |
| 8,680,846 B2 | 3/2014 | Cesaretti et al. |
| 8,692,546 B2 | 4/2014 | Cesaretti et al. |
| 8,736,369 B2 | 5/2014 | Petrie |
| 8,818,749 B2 | 8/2014 | Friedrich et al. |
| 9,046,562 B2 | 6/2015 | Cummings et al. |
| 9,052,349 B2 | 6/2015 | Haas et al. |
| 9,151,807 B2 | 10/2015 | Friedrich et al. |
| 9,347,998 B2 | 5/2016 | Szczeszynski et al. |
| 9,605,975 B2 | 3/2017 | Foletto et al. |
| 9,810,519 B2 | 11/2017 | Taylor et al. |
| 10,120,017 B2 | 11/2018 | Moody et al. |
| 10,254,103 B2 | 4/2019 | Taylor et al. |
| 10,260,905 B2 | 4/2019 | David et al. |
| 10,310,028 B2 | 6/2019 | Latham et al. |
| 10,324,141 B2 | 6/2019 | Latham et al. |
| 10,444,299 B2 | 10/2019 | Romero et al. |
| 10,481,219 B2 | 11/2019 | Romero et al. |
| 10,613,158 B2 | 4/2020 | Cook et al. |
| 10,641,842 B2 | 5/2020 | Latham et al. |
| 10,692,362 B2 | 6/2020 | Petrie et al. |
| 10,705,560 B1 | 7/2020 | Petrie |
| 10,746,820 B2 | 8/2020 | Lassalle-Balier et al. |
| 10,761,120 B2 | 9/2020 | Feucht et al. |
| 10,763,219 B2 | 9/2020 | Almiron et al. |
| 10,823,789 B2 | 11/2020 | Rossi et al. |
| 10,837,800 B2 | 11/2020 | Vig et al. |
| 10,837,943 B2 | 11/2020 | Romero |
| 10,884,031 B2 | 1/2021 | Vuillermet et al. |
| 10,917,092 B2 | 2/2021 | Romero |
| 10,921,373 B2 | 2/2021 | Lassalle-Balier et al. |
| 10,996,289 B2 | 5/2021 | Latham et al. |
| 11,047,933 B2 | 6/2021 | Romero et al. |
| 11,073,577 B2 | 7/2021 | Romero et al. |
| 11,125,837 B2 | 9/2021 | Kulla |
| 11,143,732 B2 | 10/2021 | Romero et al. |
| 11,228,466 B2 | 1/2022 | Petrie et al. |
| 11,262,422 B2 | 3/2022 | Romero |
| 11,303,257 B2 | 4/2022 | Daubert et al. |
| 11,366,141 B1 | 6/2022 | Daubert et al. |
| 11,408,948 B2 | 8/2022 | Lassalle-Balier |
| 11,467,233 B2 | 10/2022 | Lassalle-Balier et al. |
| 11,493,361 B2 | 11/2022 | Romero |
| 11,515,246 B2 | 11/2022 | Chetlur et al. |
| 11,555,872 B2 | 1/2023 | Romero |
| 11,609,283 B2 | 3/2023 | Romero |
| 11,624,791 B2 | 4/2023 | Romero |
| 11,927,650 B2 | 3/2024 | Romero |
| 11,994,541 B2 | 5/2024 | Messier et al. |
| 12,235,294 B2 | 2/2025 | Messier et al. |
| 12,253,576 B2 | 3/2025 | Romero |
| 2007/0114992 A1 | 5/2007 | Muniraju et al. |
| 2007/0247141 A1 | 10/2007 | Pastre et al. |
| 2009/0024889 A1 | 1/2009 | Forrest et al. |
| 2015/0022193 A1 | 1/2015 | Burdette et al. |
| 2015/0022198 A1 | 1/2015 | David et al. |

| | | | |
|---|---|---|---|
| 2016/0025820 A1 | 1/2016 | Scheller et al. | |
| 2016/0139199 A1 | 5/2016 | Petrie et al. | |
| 2018/0340986 A1 | 11/2018 | Latham et al. | |
| 2018/0340989 A1 | 11/2018 | Latham et al. | |
| 2019/0025346 A1 | 1/2019 | Latham | |
| 2019/0079146 A1 | 3/2019 | Romero et al. | |
| 2019/0312579 A1 | 10/2019 | Romero | |
| 2020/0022529 A1 | 1/2020 | Jalali et al. | |
| 2020/0225298 A1 | 7/2020 | Latham et al. | |
| 2021/0041511 A1* | 2/2021 | Romero | G01R 33/0017 |
| 2021/0057330 A1 | 2/2021 | Briano et al. | |
| 2021/0181269 A1 | 6/2021 | Ishida et al. | |
| 2022/0076105 A1 | 3/2022 | Foroutan et al. | |
| 2022/0308131 A1 | 9/2022 | Romero | |
| 2023/0124351 A1 | 4/2023 | Lutz | |
| 2023/0204693 A1 | 6/2023 | Romero | |
| 2023/0283250 A1 | 9/2023 | Uberti et al. | |
| 2024/0168104 A1 | 5/2024 | Javvaji et al. | |
| 2025/0180670 A1 | 6/2025 | Romero | |
| 2025/0306137 A1 | 10/2025 | Pavlov et al. | |

OTHER PUBLICATIONS

U.S. Appl. No. 18/527,675, filed Dec. 4, 2023, Romero, et al.
U.S. Appl. No. 18/606,252, filed Mar. 15, 2024, Mangtani, et al.
U.S. Appl. No. 18/615,267, filed Mar. 25, 2024, Cesaretti, et al.
J. Mathon, "Theory of Tunneling Magnetoresistance;" *Phase Transitions*, vol. 76, Nos. 4-5; Jan. 2003; pp. 491-500; 11 Pages.
Pong et al., "Enhancement of Tunneling Magnetoresistance by Optimization of Capping Layer Thickness in CoFeB/MgO/CoFeB Magnetic Tunnel Junctions;" Journal of Applied Physics, vol. 105, No. 7; Apr. 2009; 3 Pages.
U.S. Non-Final Office Action dated Apr. 23, 2020 for U.S. Appl. No. 15/901,135; 17 pages.
Response to U.S. Non-Final Office Action dated Apr. 23, 2020 for U.S. Appl. No. 15/901,135; Response filed Jul. 17, 2020; 10 pages.
U.S. Final Office Action dated Sep. 3, 2020 for U.S. Appl. No. 15/901,135; 15 pages.
Response to U.S. Final Office Action dated Sep. 3, 2020 for U.S. Appl. No. 15/901,135; Response filed Nov. 23, 2020; 13 pages.
U.S. Non-Final Office Action dated Apr. 12, 2021 for U.S. Appl. No. 15/901,135; 16 pages.
Response to U.S. Final Office Action dated Apr. 12, 2021 for U.S. Appl. No. 15/901,135; Response filed May 25, 2021; 11 pages.
U.S. Notice of Allowance dated Aug. 17, 2021 for U.S. Appl. No. 15/901,135; 9 pages.
Notice of Allowance Dated Apr. 7, 2021 for U.S. Appl. No. 16/533,030, 10 pages.
U.S. Notice of Allowance dated Jul. 29, 2022 for U.S. Appl. No. 17/140,429; 11 Pages.
1st Amendment under Rule 312 filed on Aug. 15, 2022 for U.S. Appl. No. 17/140,429; 5 Pages.
2nd Amendment under Rule 312 filed on Oct. 3, 2022 for U.S. Appl. No. 17/140,429; 7 Pages.
Notice of Allowance dated Jan. 18, 2024, for U.S. Appl. No. 17/659,515; 11 pages.
Extended European Search Report dated Oct. 28, 2022 for European Application No. 22172865.2; 8 Pages.
Response to Extended European Search Report dated Oct. 28, 2022, for European Patent Application No. 22172865.2; Response filed Nov. 27, 2023; 13 pages.
Notice of Allowance dated Feb. 8, 2023 for U.S. Appl. No. 17/140,429; 7 Pages.
U.S. Appl. No. 18/804,159, filed Aug. 14, 2024, Rossi.
U.S. Appl. No. 19/032,167, filed Jan. 20, 2025, Romero.
U.S. Appl. No. 19/207,786, filed May 14, 2025, Romero.

* cited by examiner

LEGEND

⊗ -PILLAR

▦ -CONDUCTOR CONNECTING BOTTOMS OF ADJACENT PILLARS

▨ -CONDUCTOR CONNECTING TOPS OF ADJACENT PILLARS

LEGEND

-PILLAR

■ -CONDUCTOR CONNECTING BOTTOMS OF ADJACENT PILLARS

▨ -CONDUCTOR CONNECTING TOPS OF ADJACENT PILLARS

LEGEND

● -PILLAR

■ -CONDUCTOR CONNECTING BOTTOMS OF ADJACENT PILLARS

▨ -CONDUCTOR CONNECTING TOPS OF ADJACENT PILLARS

500

RECEIVE A COUNTER VALUE
502

SELECT A STATE FOR TMR 202 BASED ON THE COUNTER VALUE
504

SELECT A STATE FOR TMR 204 BASED ON THE COUNTER VALUE
506

SELECT A STATE FOR TMR 206 BASED ON THE COUNTER VALUE
508

SELECT A STATE FOR TMR 208 BASED ON THE COUNTER VALUE
510

600

| COUNTER_VALUE | CONTROL CODE SET |
|---|---|
| VAL_1 | SET_1 |
| VAL_2 | SET_2 |
| VAL_N | SET_N |

135

→ Test or reference local field, 1310

←·—·— TMR sensitive direction

----→ External magnetic field direction $$V_{o+} - V_{o-} = 0 \mid_{Bi=0}$$

SENSOR WITH COMMON MODE REJECTION AND OFFSET CORRECTION

CROSS-REFERENCE TO RELATED APPLICATIONS

This application is a continuation-in-part application and claims the benefit of U.S. patent application Ser. No. 18/527,675 filed on Dec. 4, 2023, which is incorporated herein by reference in its entirety.

BACKGROUND

As is known, sensors are used to perform various functions in a variety of applications. Some sensors include one or more electromagnetic flux sensing elements, such as a Hall effect element, a magnetoresistive element, or a receiving coil to sense an electromagnetic flux associated with proximity or motion of a target object. Sensor integrated circuits are widely used in automobile control systems and other safety-critical applications. There are a variety of specifications that set forth requirements related to permissible sensor quality levels, failure rates, and overall functional safety.

SUMMARY

According to the disclosure, a system includes a sensing element including a first element of a first element type that is responsive to a magnetic field and a second element of a second element type that is not responsive to the magnetic field, wherein the second element is coupled to the first element and includes a plurality of passive resistor unit cells, a switching matrix that is configured to change a total resistance of the sensing element by coupling one or more of the plurality of passive resistor unit cells to the sensing element or by decoupling one or more of the plurality of passive resistor unit cells from the sensing element, and a matrix controller that is configured to cause the switching matrix to change the total resistance of the sensing element by coupling or decoupling one or more of the plurality of passive resistor unit cells.

Features may include one or more of the following individually or in combination with other features. The first element type can be a tunneling magnetoresistance element (TMR) comprising a plurality of dots. The sensing element can be part of a sensing bridge. The switching matrix can include a plurality of switches, each arranged to bypass one or more of the plurality of passive resistor unit cells and the matrix controller can include electronic circuitry that is configured to independently turn on and off each of the plurality of switches. The matrix controller can be configured to detect when a value of a counter signal is updated and cause the switching matrix to change the total resistance of the sensing element based on the value of the counter signal and a counter signal generator can be configured to detect whether a CMRR signal representative of the CMRR of the sensing element satisfies a predetermined condition and update the value of the counter signal in response to the CMRR signal satisfying the predetermined condition. The CMRR signal can be generated based on a sensing signal that is at least in part generated by the sensing element, the sensing element is part of a sensing bridge and the sensing signal is a differential signal that is output by the sensing bridge. The counter signal generator can include a low-pass filter, a counter, and a comparator that is configured to supply an enable signal to the counter, the low-pass filter being configured to generate the CMRR signal by filtering the sensing signal, the comparator being configured to set the enable signal to a predetermined value when the CMRR signal is outside of predetermined bounds, the value of the counter signal being updated when the enable signal is set to the predetermined value. The sensing element can be configured to receive a residual magnetic field including a difference between an applied magnetic field produced by a source at a first frequency and a feedback magnetic field and produce a superimposed signal comprising a main signal portion, feedback coil circuitry coupled to receive the superimposed signal and including a feedback coil configured to generate the feedback magnetic field, and main processing circuitry operative to extract the main signal portion from the superimposed signal and produce a sensor output signal based on the main signal portion, wherein the main signal portion is indicative of a physical parameter associated with the source.

According to a further aspect of the disclosure, a magnetic field sensor includes a sensing bridge including a sensing element configured to receive an applied magnetic field at a first frequency, wherein the sensing element includes one or both of a magnetoresistance element that is responsive to the applied magnetic field and that includes a plurality of dots and a passive resistor that is not responsive to the applied magnetic field and that includes a plurality of passive resistor unit cells, test signal generation circuitry configured to generate a common mode test magnetic field at a second frequency and combine the common mode test magnetic field with the applied magnetic field to generate a combined signal comprising a main signal portion, main processing circuitry configured to extract the main signal portion from the combined signal and produce a sensor output signal based on the main signal portion, and test signal processing circuitry configured to monitor a differential output of the sensing bridge at the second frequency to determine a sensitivity mismatch of the sensing bridge.

Features may include one or more of the following individually or in combination with other features. The magnetic field sensor can further include a switching matrix that is configured to change a total resistance of the sensing element by coupling one or more of the plurality of dots to the sensing element or by decoupling one or more of the plurality of dots from the sensing element and a matrix controller that is configured to cause the switching matrix to change the total resistance of the sensing element by coupling or decoupling one or more of the plurality of dots. The matrix controller can be configured to detect when a value of a counter signal is updated and cause the switching matrix to change the total resistance of the sensing element based on the value of the counter signal and a counter signal generator can be configured to detect whether a signal representative of an offset of the sensing bridge satisfies a predetermined condition and update the value of the counter signal in response to the signal representative of the offset satisfying the predetermined condition. The predetermined condition can be satisfied when the offset of the sensing bridge is outside of predetermined bounds. The magnetic field sensor can further include switching matrix that is configured to change a total resistance of the sensing element by coupling one or more of the plurality of passive resistor unit cells to the sensing element or by decoupling one or more of the plurality of passive resistor unit cells from the sensing element and a matrix controller that is configured to cause the switching matrix to change the total resistance of the sensing element by coupling or decoupling one or more of the plurality of passive resistor unit cells. The matrix controller can be configured to detect when a value of a counter signal is updated and cause the switching matrix to change the total resistance of the sensing element based on the value of the counter signal and a counter signal generator configured to detect whether a signal representative of the CMRR of the sensing bridge satisfies a predetermined condition and update the value of the counter signal in response to the signal representative of the CMRR satisfying the predetermined condition. The predetermined condition can be satisfied when the CMRR of the sensing bridge is outside of predetermined bounds.

According to a further aspect of the disclosure, a magnetic field sensor includes a sensing bridge including a sensing element configured to receive an applied magnetic field at a first frequency, wherein the sensing element includes a magnetoresistance element that is responsive to the applied magnetic field and that includes a plurality of dots and a passive resistor that is not responsive to the applied magnetic field and that includes a plurality of passive resistor unit cells, test signal generation circuitry configured to generate a common mode test magnetic field at a second frequency and combine the common mode test magnetic field with the applied magnetic field to generate a combined signal comprising a main signal portion, main processing circuitry configured to extract the main signal portion from the combined signal and produce a sensor output signal based on the main signal portion, and test signal processing circuitry configured to monitor a differential output of the sensing bridge at the first frequency to determine an offset mismatch of the sensing bridge and to monitor the differential output of the sensing bridge at the second frequency to determine a CMRR of the sensing bridge.

Features may include one or more of the following individually or in combination with other features. The magnetic field sensor may further include a first switching matrix that is configured to change a total resistance of the sensing element by coupling one or more of the plurality of passive resistor unit cells to the sensing element or by decoupling one or more of the plurality of passive resistor unit cells from the sensing element, a second switching matrix that is configured to change a total resistance of the sensing element by coupling one or more of the plurality of dots to the sensing element or by decoupling one or more of the plurality of dots from the sensing element, and a matrix controller that is configured to cause the first switching matrix and the second switching matrix to change the total resistance of the sensing element. The first switching matrix can include a first plurality of switches, each arranged to bypass one or more of the plurality of passive resistor unit cells, the second switching matrix can include a second plurality of switches, each arranged to bypass one or more of the plurality of dots, and the matrix controller can include electronic circuitry that is configured to independently turn on and off each of the first plurality of switches and the second plurality of switches. The matrix controller can be configured to detect the CMRR of the sensing bridge and cause the first switching matrix to change the total resistance of the sensing element if the detected CMRR satisfies a first predetermined condition and to detect an offset of the sensing bridge and cause the second switching matrix to change the total resistance of the sensing element if the detected offset satisfies a second predetermined condition.

BRIEF DESCRIPTION OF THE DRAWINGS

The foregoing features may be more fully understood from the following description of the drawings in which.

DETAILED DESCRIPTION

Figure 1A:
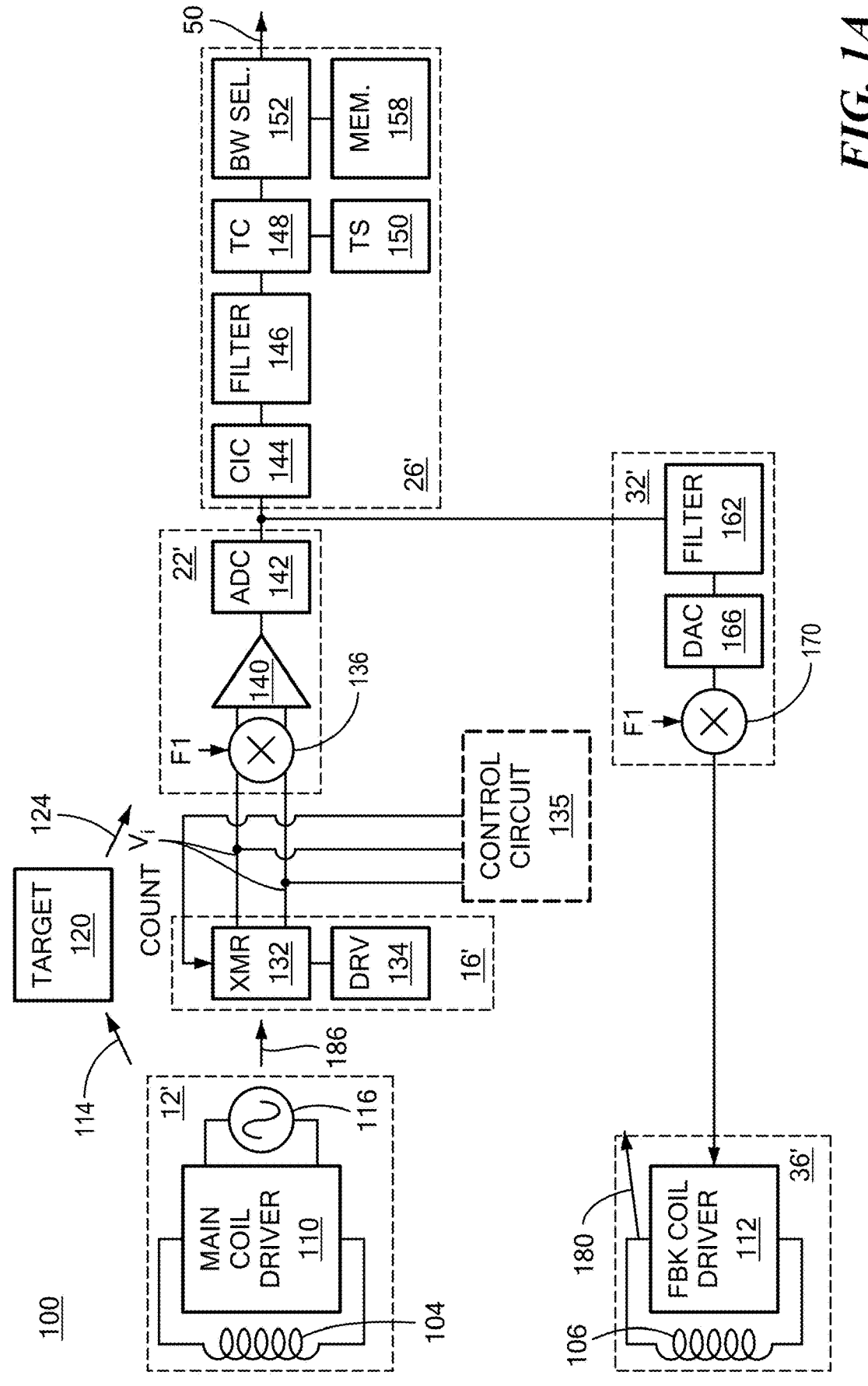
FIG. 1A is a diagram of an example of a sensor, according to aspects of the disclosure.

FIG. 1A is a diagram of a magnetic field sensor 100, according to aspects of the disclosure. The magnetic field sensor 100 includes main coil circuitry 12', magnetoresistance circuitry 16', analog circuitry 22', digital circuitry 26', feedback circuitry 32', and feedback, or secondary coil circuitry 36'.

In one example, the main coil circuitry 12' may include a main coil 104, a coil driver circuit 110 and a source 116 (e.g., a current source or a voltage source). The source 116 provides an AC current $I_{MC}$ at a first frequency F1. In one example, the first frequency F1 is between 1 and 8 MHz.

The current $I_{MC}$ enables the coil driver circuit 110 to power the main coil 104 to generate a magnetic field signal 114. In one example, the main coil 104 has a coupling factor $K_{MC}$ of 60. Gauss per amp.

In one example, the magnetoresistance circuitry 16' includes a sensing bridge 132 and a driver 134 that drives the sensing bridge 132. The sensing bridge 132 may receive a magnetic-field error signal 186, which is converted into a differential output voltage signal called herein an error signal $V_i$. Under the nomenclature of the present disclosure, the signal Vi is called an error signal because it carries an error, but it can also be thought of as the raw output of sensing bridge 132. In other words, signal Vi may be thought of as the result of the magnetic error signal, generated as the difference between the sum of the magnetic field generated by the main coil 104 and the reflected field from target 120, minus the feedback coil field. Ideally this subtraction should yield zero if the loop had infinite loop gain. Since realistic loops have finite (although large) gains, the error signal will not be zero, although very small. The sensing bridge 132 may be a half-bridge or a full bridge (e.g., a Wheatstone bridge circuit) or even two bridges electrically connected such that their output signals are subtracted in order to differentially sense a magnetic field. According to the present example, the sensing bridge 132 includes a plurality of tunneling magnetoresistance elements (TMRs). However, the present disclosure is not limited to any specific type of sensing element being included in the sensing bridge 132. For example, in some implementations, the sensing bridge 132 may include giant magnetoresistance elements (GMRs), Hall elements, and/or any other suitable type of magnetic field sensing element, for as long as the magnetic field sensing element is formed of sub-units (such as pillars), which could be selectively turned on and off to adjust the resistance of the sensing element. Although, in the present example, circuit 132 is a bridge circuit, alternative implementations are possible in which circuit 132 is a serial circuit and/or any other suitable type of circuit. Stated succinctly, the present disclosure is not limited to any specific topology for connecting the magnetic field sensing elements that are part of sensor 100.

In one example, the analog circuitry 22' may include a mixer 136, an amplifier 140, and an analog-to-digital converter (ADC) 142.

The mixer 136 receives the error signal $V_i$ from the magnetoresistance circuitry 16' and demodulates the error signal $V_i$ with the first frequency to form a baseband signal. The baseband signal is amplified by the amplifier 140 by a gain A. The amplified baseband signal is converted from an analog signal to a digital signal by the ADC 142. In one example, the ADC 142 may be a sigma-delta ADC.

The digital circuitry 26' is an example of the digital circuitry 26. In one example, the digital circuitry 26' may include a cascaded integrator-comb (CIC) filter 144, a filter 146, a temperature correction circuit 148, a temperature sensor 150, a bandwidth (BW) selection circuit 152, and a programming and memory circuit 158.

The CIC filter 144 receives the digital baseband signal from the ADC 142. The filter 146 may be a low pass filter configured to filter noise and other artifacts from output of the CIC filter 144 to produce an output voltage signal $V_o$. The temperature correction circuit 148 may scale the output voltage signal $V_o$ according to temperature (e.g., a temperature measured by the temperature sensor 150). The BW selection circuit 152 provides a further low-pass filtering with a selectable cut-off frequency to generate the output signal 50.

In one example, the feedback circuitry 32' includes a filter 162, a digital-to analog converter (DAC) 166 and a mixer 170. The filter 162 may be a low pass filter configured to filter noise and other artifacts from output of the CIC filter 144. The DAC 166 receives the filtered digital output signal from the filter 162 and converts the filtered digital output signal to an analog signal and converts the filtered digital output signal from a digital voltage signal to an analog current signal. The analog current signal from the DAC 166 is provided to a mixer 170. The mixer 170 mixes the analog current signal with the first frequency F1 to form an AC current signal $I_{SC}$ to enable the feedback, or secondary coil driver circuit 112 to drive the feedback, or secondary coil 106.

In one example, the secondary coil circuitry 36' includes a secondary coil 106 and a secondary coil driver circuit 112. The AC current signal $I_{SC}$ enables the secondary coil driver circuit 112 to power the secondary coil 106 to produce the magnetic field signal 180. In one example, the secondary coil 106 has a coupling factor $K_{SC}$ of 800. Gauss per amp.

The magnetic field signal 180 is combined with the reflected field signal 124, and also any signal directly coupled from the main coil 104 to driver 134, at a medium to form the magnetic-field error signal 186. The medium may be air. The medium may not be on the magnetic field sensor 100.

The magnetic field sensor 100 may be analyzed in terms of the error signal $V_i$, the output $V_o$ and the reflected signal 124 as defined as:

$$V_i = (B_{RF}(x) + B_{mc}) \cdot S_{TMR} - V_o \cdot d \cdot K_{SC} \cdot S_{TMR},$$

where $B_{RF}(x)\cdot$ is the magnetic field signal 124, $B_{mc}$ is the field directly coupled from the main coil 104 and $V_o \cdot d \cdot K_{SC} \cdot S_{TMR}$ is the magnetic field signal 180, and:

$$V_0 = V_i \cdot A = ((B_{RF}(x) + B_{mc}) \cdot S_{TMR} - V_o \cdot d \cdot K_{SC} \cdot S_{TMR}) \cdot A,$$

$$B_{RF(x)} = I_{MC} \cdot K_R(x),$$

$$B_{mc} = I_{MC} \cdot K_d$$

$$K_R(x) = \frac{K_{MC} \cdot K_{cond}}{x^2},$$

$$I_{SC} = V_o \cdot d,$$

where: $S_{TMR}$=TMR sensitivity, d=voltage–to–current feedback gain, $A \cdot S_{TMR}$ loop gain, $B_{RF}(x)$=reflected field as a function of the target's position x, $K_R$ (x)=reflected field coupling factor and $K_D$ is the direct field coupling factor from the main coil.

The output signal $V_o$ may be defined as follows:

$$V_o = \frac{I_{MC} \cdot K_r(x) \cdot S_{TMR} \cdot A}{1 + d \cdot K_{SC} \cdot S_{TMR} \cdot A} + \frac{I_{MC} \cdot K_d \; S_{TMR} \cdot A}{1 + d \cdot K_{SC} \cdot S_{TMR} \cdot A}$$

and the system gain (for $B_{mc}$=0) of the magnetic field sensor 100 may be expressed as:

$$\frac{V_o}{K_R(x)} = \frac{I_{MC} \cdot S_{TMR} \cdot A}{1 + d \cdot K_{SC} \cdot S_{TMR} \cdot A}.$$

Where the term $$\frac{I_{MC} \cdot K_d \; S_{TMR} \cdot A}{1 + d \cdot K_{SC} \cdot S_{TMR} \cdot A}$$

represents the "magnetic offset" of the system, which can be trimmed provided it does not depend on (x)

For $S_{TMR} \cdot A >> 1$, then the system gain of the magnetic field sensor 100

$$\frac{I_{MC}}{d \cdot K_{SC}}.$$

For a high enough loop gain, the system gain is independent of $S_{TMR}$ and the output voltage $V_o$ is proportional to the reflection coefficient:

$$V_o = K_R \cdot \frac{I_{MC}}{d \cdot K_{SC}}.$$

Thus, the proportionality factor depends on the ratio of the main coil current $I_{MC}$ to the voltage-to-current feedback gain d and the secondary coil coupling factor $K_{SC}$.

Since the reflected signal 124 is modulated at a high frequency, the magnetic-field error signal 186 is demodulated from the first frequency F1 in the forward path down to the baseband for further conditioning. Therefore, the magnetic-field feedback loop remodulates the conditioned signal back to the first frequency F1 before magnetically subtracting it from the originally reflected signal 124.

As described herein, the non-linear behavior of the TMRs in sensing bridge 132 is masked by the magnetic-field closed-loop approach and the overall system gain does not depend on the sensitivity of any of the TMRs in sensing bridge 132. The secondary coil 106 compensates for reflected fields from the target 120 and keeps the TMRs in sensing bridge 132 element at an operating point at or near zero Gauss. In some implementations, target 120 may be a rotating target, in which case the signal output from sensing bridge 132 may be an alternating current (AC) signal.

Magnetic field sensor 100 may be provided with a control circuit 135. The control circuit 135 may be used to correct any resistive imbalance that might exist between the TMRs in sensing bridge 132. As used herein, the phrase "correct resistive imbalance" refers to making the respective resistances of all (or at least two) of the TMRs equal (or close to being equal—i.e., within a predetermined distance from each other). As will become apparent, control circuit 135 can operate in a static manner or in a dynamic manner to correct any resistive imbalance. By static control, it means that a one-time trimming process is used. For example, for trimming, the DC offset attributable to resistive imbalances can be measured and the TMRs can be trimmed to compensate accordingly. By dynamic control, it means that the TMRs are periodically controlled to compensate for any resistive imbalance. For example, in the embodiments of FIGS. 1A-7, control circuit 135 is described in the context of dynamic control by which feedback is used, in which case the control circuit 135 can be referred to as an autozero circuit. The autozero circuit 135 may be configured to generate a signal COUNT and provide it to sensing bridge 132, after which the value of the signal COUNT may be used by control circuitry in sensing bridge 132 to select the appropriate resistance for at least one of the TMRs in the sensing bridge 132.

In one example, the term "sensing signal that is at least in part generated by one or more sensing elements" may refer to any of: (i) the raw output (Vi) of sensing bridge 132, the output of demodulator 136, the output of ADC 142, the output of CIC 144, the output of filter 146, or the output of TC 148. The sensing signal, in addition to indicating a useful quantity that is desired to be measured, may also carry noise, offset, and/or other sources of error. Stated succinctly, the phrase "sensing signal that is at least in part generated by one or more sensing elements" may refer to the raw output of the one or more sensing elements or any other signal that is generated by processing the raw output.

Figure 1B:
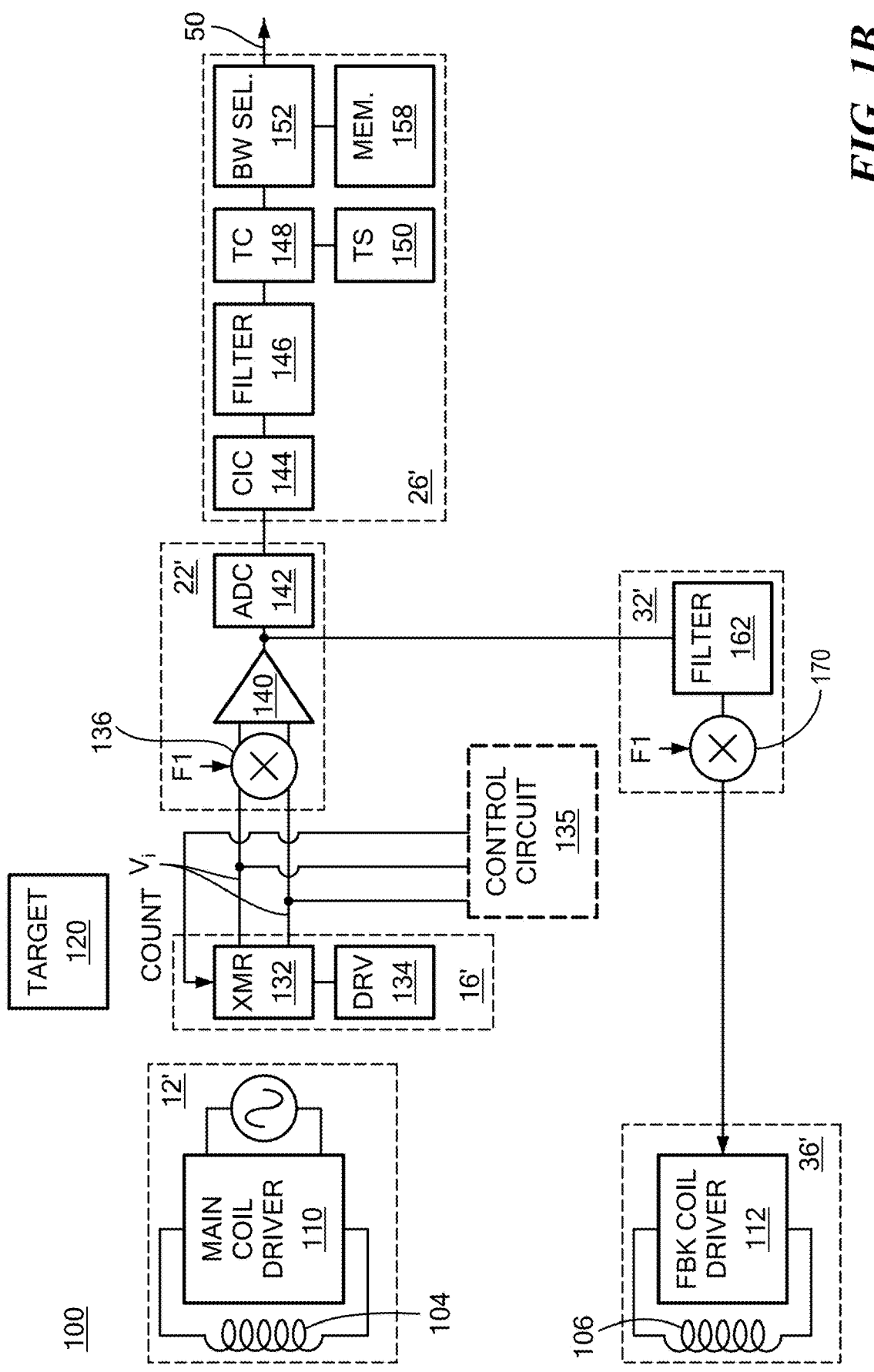
FIG. 1B is a diagram of an example of a sensor, according to aspects of the disclosure.

FIG. 1B shows an alternative implementation of magnetic field sensor 100. In the implementation of FIG. 1B, feedback circuitry 32' is configured to operate in the analog domain. Apart from this distinction, the system shown in FIG. 1B is identical to the system shown in FIG. 1A.

Figure 2:
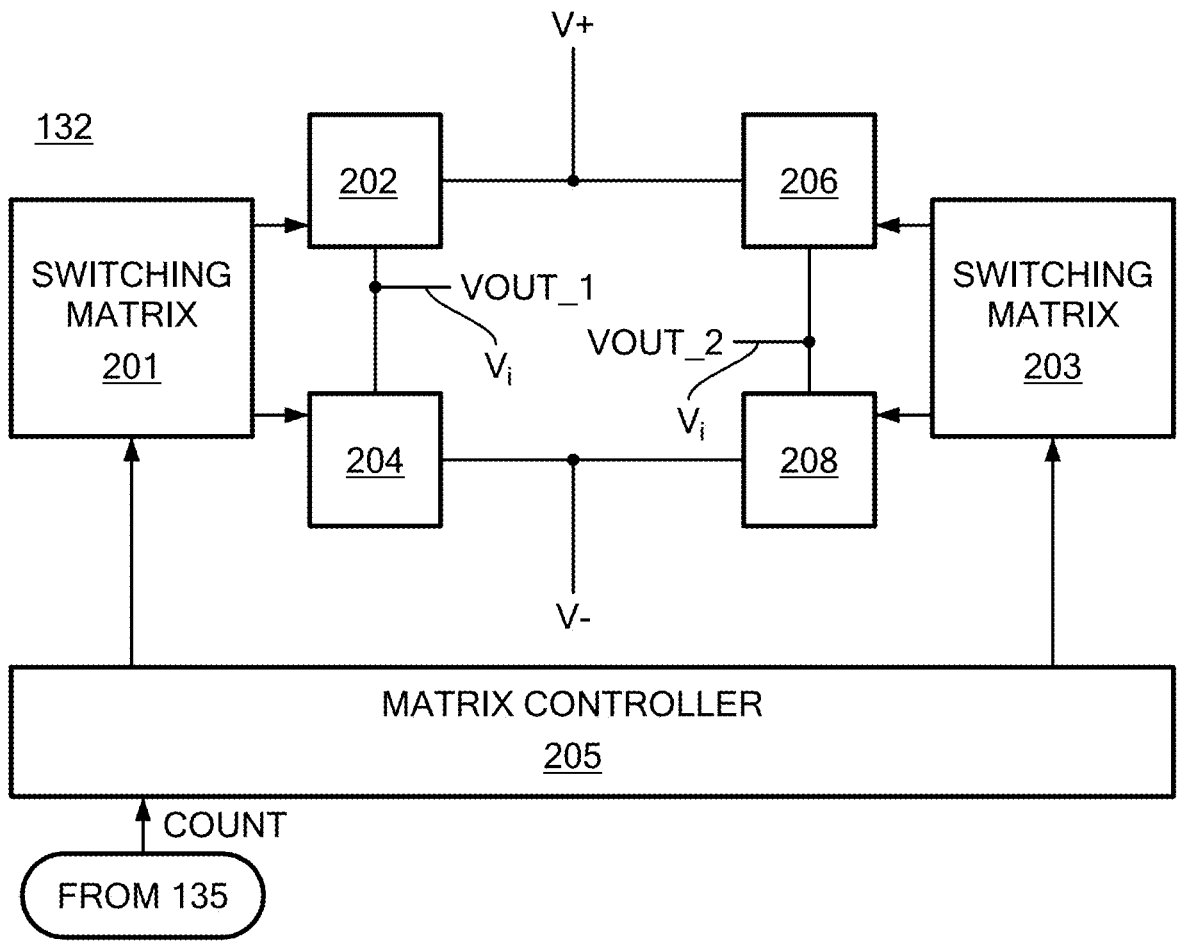
FIG. 2 is a diagram of an example of a sensing bridge, according to aspects of the disclosure.

FIG. 2 is a diagram of sensing bridge 132, according to aspects of the disclosure. As illustrated, sensing bridge 132 may include TMRs 202, 204, 206, and 208, switching matrices 201 and 203, and a matrix controller 205. According to the present example, switching matrix 201 is configured to switch pillars in each of TMRs 202 and 204. However, alternative implementations are possible in which a different switching matrix is provided for each of TMRs 202 and 204. According to the present example, switching matrix 203 is configured to switch pillars in each of TMRs 206 and 208. However, alternative implementations are possible in which a different switching matrix is provided for each of TMRs 206 and 208. Although, in the present example, switching matrix 201 and switching matrix 203 are depicted as separate entities, alternative implementations are possible in which they are integrated with each other. Each of switching matrices 201 and 203 may include a plurality of switches that are configured to connect or disconnect pillars in one of TMRs 202-208 from the rest of the pillars in the same TMR. Matrix controller 205 may include any suitable type of circuitry that is configured to switch on and off each (or at least some) of the switches in switching matrices 201 and 203. By way of example, matrix controller 205 may include a general-purpose processor, a special-purpose processor, an application-specific circuit, and/or any other suitable type of processing circuitry. In one example, matrix controller 205 may be configured to perform a process 500, which is discussed further below with respect to FIG. 5. In some implementations, matrix controller 205 may be provided separately of sensing bridge 132. Additionally, or alternatively, in some implementations, matrix controller 205 may be integrated in other circuitry that is part of sensor 100.

Figure 3:
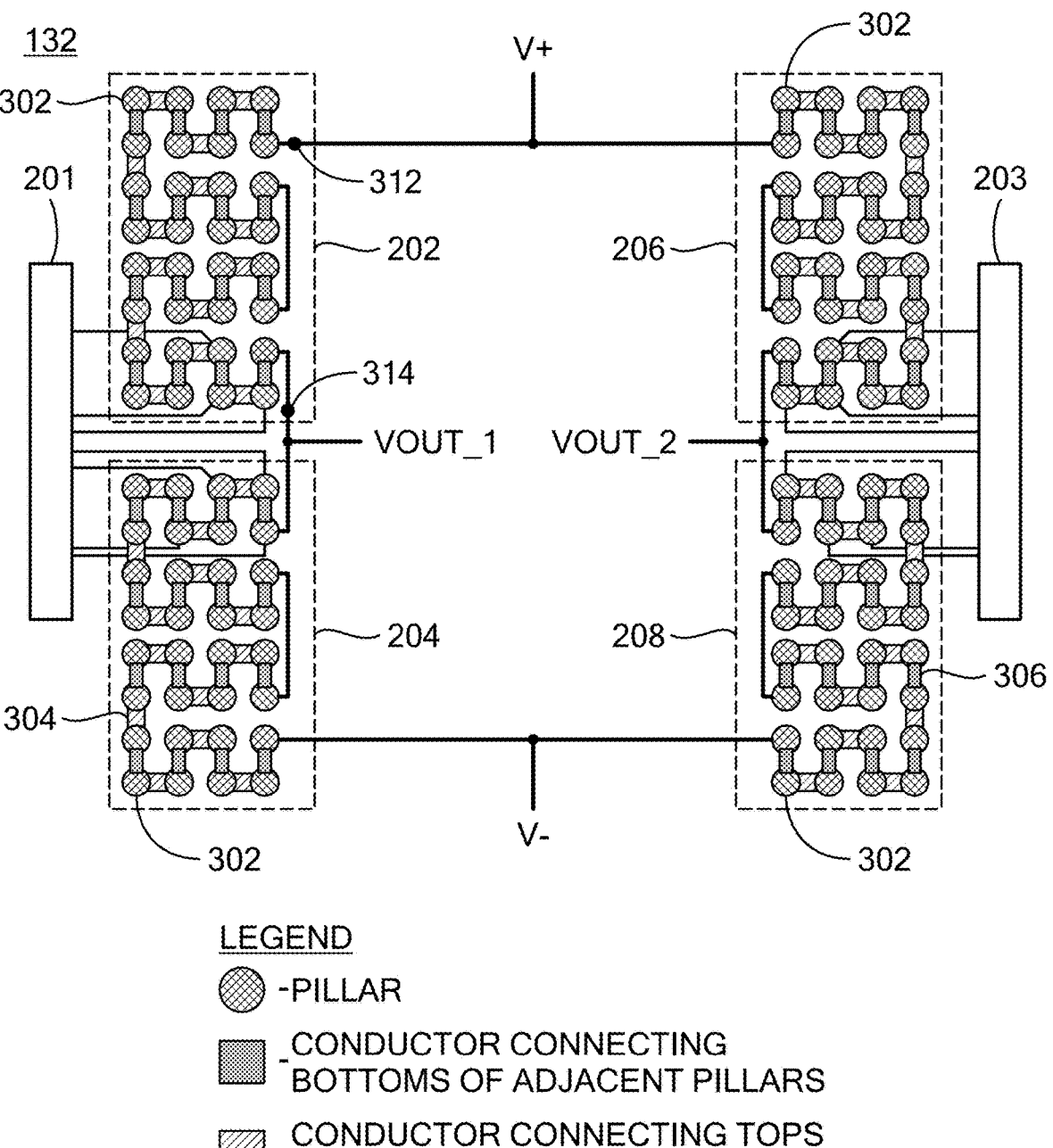
FIG. 3 is a diagram of an example of a sensing bridge, according to aspects of the disclosure.

FIG. 3 shows sensing bridge 132 in further detail. As illustrated, each of TMRs 202, 204, 206, and 208 includes a plurality of pillars 302. The pillars in each of TMRs 202, 204, 206, and 208 may be connected in series to each other. As illustrated in FIG. 3, the connection may be accomplished by using conductors (e.g., conductive traces) that connect the respective tops and bottoms of adjacent pillars 302. However, it will be understood that in some implementations, the pillars in at least one of TMRs 202, 204, 206, and 208 may be connected in parallel with each other. Stated succinctly, the present disclosure is not limited to any specific topology for connecting the pillars 302 in any given one of the TMRs 202, 204, 206, and 208. According to the present example, all of the pillars in any of TMRs 202, 204, 206, and 208 have the same resistance. However, alternative implementations are possible in which at least two pillars 302, any given one of TMRs 202, 204, 206, and 208, have different resistances.

As is well known in the art, a "pillar" or "dot" is a fundamental structure or unit cell in a TMR element that consists of several layers of magnetic and non-magnetic materials and is designed to take advantage of the TMR effect. Each of the pillars may have a resistance that varies based on the value of a magnetic field that is incident on the pillar. The pillars in a TMR may be effectively independent sub-units of the TMR, whose resistance varies in proportion with the value of the magnetic field that is incident on them.

The total resistance of the TMR may be equal to a combination (e.g., the sum, etc.) of the individual resistances of the pillars.

Individual pillars in a TMR may be online or offline. When a pillar in a TMR is offline, the pillar does not contribute to the total resistance of the TMR. When a pillar in the TMR is online, the pillar contributes to the total resistance in the TMR. The bringing of a pillar online or offline may be performed by using a switching matrix, such as switching matrices 201 and 203. Specifically, switching matrix 201 may be configured to bring online or offline each (or at least some) of the pillars 302 in any given one of TMRs 202 and 204. Similarly, switching matrix 203 may be configured to bring offline or online each (or at least some) of the pillars 302 in any given one of TMRs 206 and 208.

Switching matrix 201 may include a plurality of switches that couple or disconnect from each other the pillars 302 in TMR 202 to bring the total resistance of TMR 202 to a desired first value. Switching matrix 201 may further include a plurality of switches that couple or disconnect from each other the pillars 302 in TMR 204 to bring the total resistance of TMR 204 to a desired second value. Switching matrix 203 may include a plurality of switches that couple or disconnect from each other the pillars 302 in TMR 202 to bring the total resistance of TMR 206 to a desired third value. Switching matrix 201 may further include a plurality of switches that couple or disconnect from each other the pillars 302 in TMR 202 to bring the total resistance of TMR 208 to a desired fourth value. The total resistance of TMRs 202, 204, 206, and 208 may be set independently of each other by switching matrices 201 and 203, such that, at any given time, any two of TMRs 202, 204, 206, and 208 may have the same total resistance values or different total resistance values.

Matrix controller 205 may be configured to control each of the switches in switching matrices 201 and 203. Specifically, matrix controller 205 may be configured to individually turn on and off each of the switches in switching matrices 201 and 203. Each of the switches may be controlled independently of the rest. In some implementations, matrix controller may include logic that is configured to: (i) identify a set of switches (or switching matrix/switching matrix portion) that are configured to connect or disconnect the pillars in the given TMR, (ii) identify a set of states for the set of switches, and (iii) cause the set of switches to assume the set of states. A switch may be either in the turned-on or turned-off state. Identifying the states for the set of switches that corresponds to the desired resistance value includes determining which ones of the switches need to be turned on and which ones of the switches need to be turned off. Identifying the set of states may include retrieving a binary string (also referred to as "a control code"), where each bit in the string corresponds to a different switch. Causing the set of switches to assume the set of states may include: for each of the switches, identifying the bit, in the bit string, that corresponds to the switch, turning on the switch if the bit value is '1', or turning off the switch if the bit value is '0'. The set of bit strings may be retrieved from a memory that is part of matrix controller 205 or from another memory.

Figure 4A:
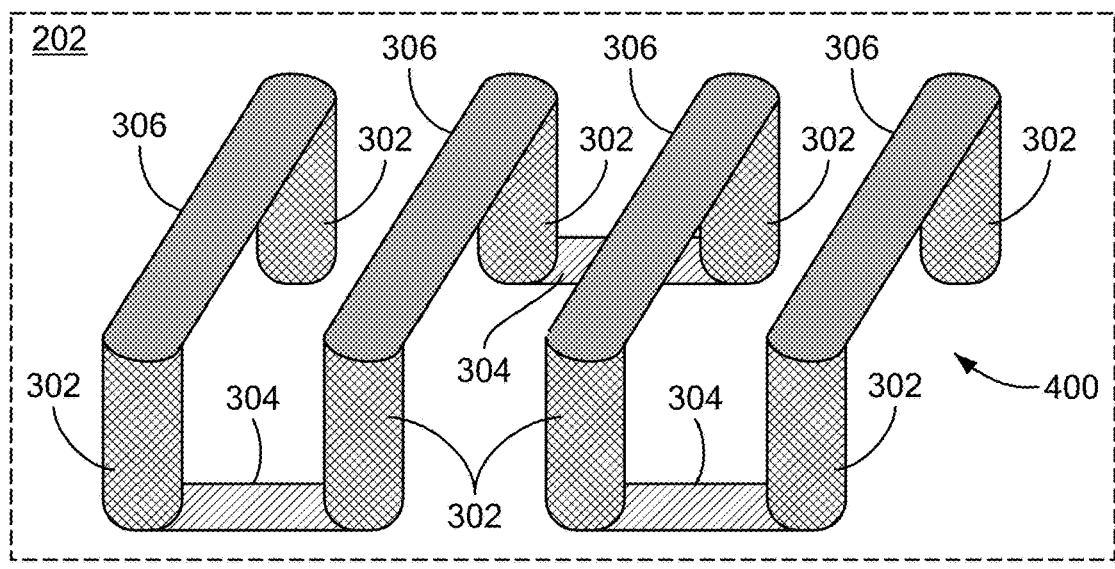
FIG. 4A is a diagram of a sensing element portion, according to aspects of the disclosure.
Figure 4A:

FIG. 4A shows an example of a TMR portion 400. According to the present example, TMR portion 400 is part of TMR 202. However, in some implementations, TMR portion 400 may be part of any of TMRs 204, 206, and 208. FIG. 4A illustrates that the tops of adjacent pillars 302 may be connected with conductors 306 and the bottoms (or bases) of adjacent pillars may be connected with conductors 304.

Figure 4B:
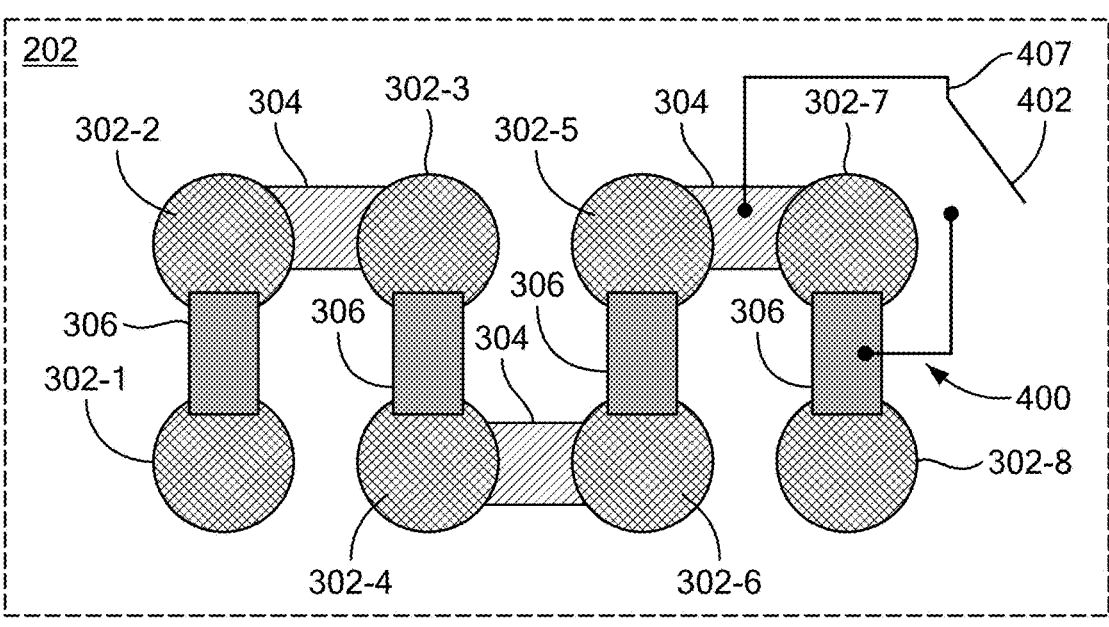
FIG. 4B is a diagram of a sensing element portion, according to aspects of the disclosure.

FIG. 4B shows an example of TMR portion 400, in accordance with another implementation. In the example of FIG. 4B, pillars 302 are enumerated as pillars 302-1, 302-2, 302-3, 302-4, 302-5, 302-6, 302-7, and 302-8. Also shown in FIG. 4B is a switch 402. Switch 402 is an example of a switch that corresponds to pillar 302-7. Switch 402 is configured to bring pillar 302-7 offline or online. When switch 402 is turned off, pillar 302-7 is online. As noted above, when the pillar is said to be online, the individual resistance of pillar 302-7 contributes to the total resistance of TMR portion 400 (and/or TMR 202). In the example of FIG. 4B, when pillar 302-7 is online, the total resistance of TMR portion 400 is equal to the sum of the individual resistances of pillars 302-1, 302-2, 302-3, 302-4, 302-5, 302-6, 302-7, and 302-8. When switch 402 is turned on, pillar 302-7 is offline. Specifically, when switch 402 is turned on, the ends of pillar 302-7 are shorted. As noted above, when pillar 302-7 is said to be offline, the individual resistance of pillar 302-7 does not contribute to the total resistance of TMR portion 400. In the example of FIG. 4B, when pillar 302-7 is offline, the total resistance of TMR portion 400 is equal to the sum of the individual resistance of pillars 302-1, 302-2, 302-3, 302-4, 302-5, 302-6, and 302-8, while pillar 302-7 has no effect on the total resistance, assuming that 402 is ideal (i.e., assuming that the resistance of switch 402 is negligible compared to a single pillar resistance). In the example of FIG. 4B, switch 402 is a part of bypass line 407, and switch 402 is configured to open and close bypass line 407.

In the example of FIGS. 4A-B, TMR portion 400 is part of part of TMR 202 and switch 402 is part of switching matrix 201. Switch 402 is an example of a bypass switch that corresponds to pillar 302-7. A bypass switch corresponds to a pillar when the switch is configured to short-circuit the pillar and prevent electrical current from flowing through the pillar. In some implementations, switching matrix 201 may include a plurality of bypass switches, wherein each of the bypass switches corresponds to a different pillar 302 in TMRs 202 and 204. In some implementations, switching matrix 203 may include a plurality of bypass switches, wherein each of the bypass switches corresponds to a different pillar 302 in TMRs 206 and 208.

Figure 4C:
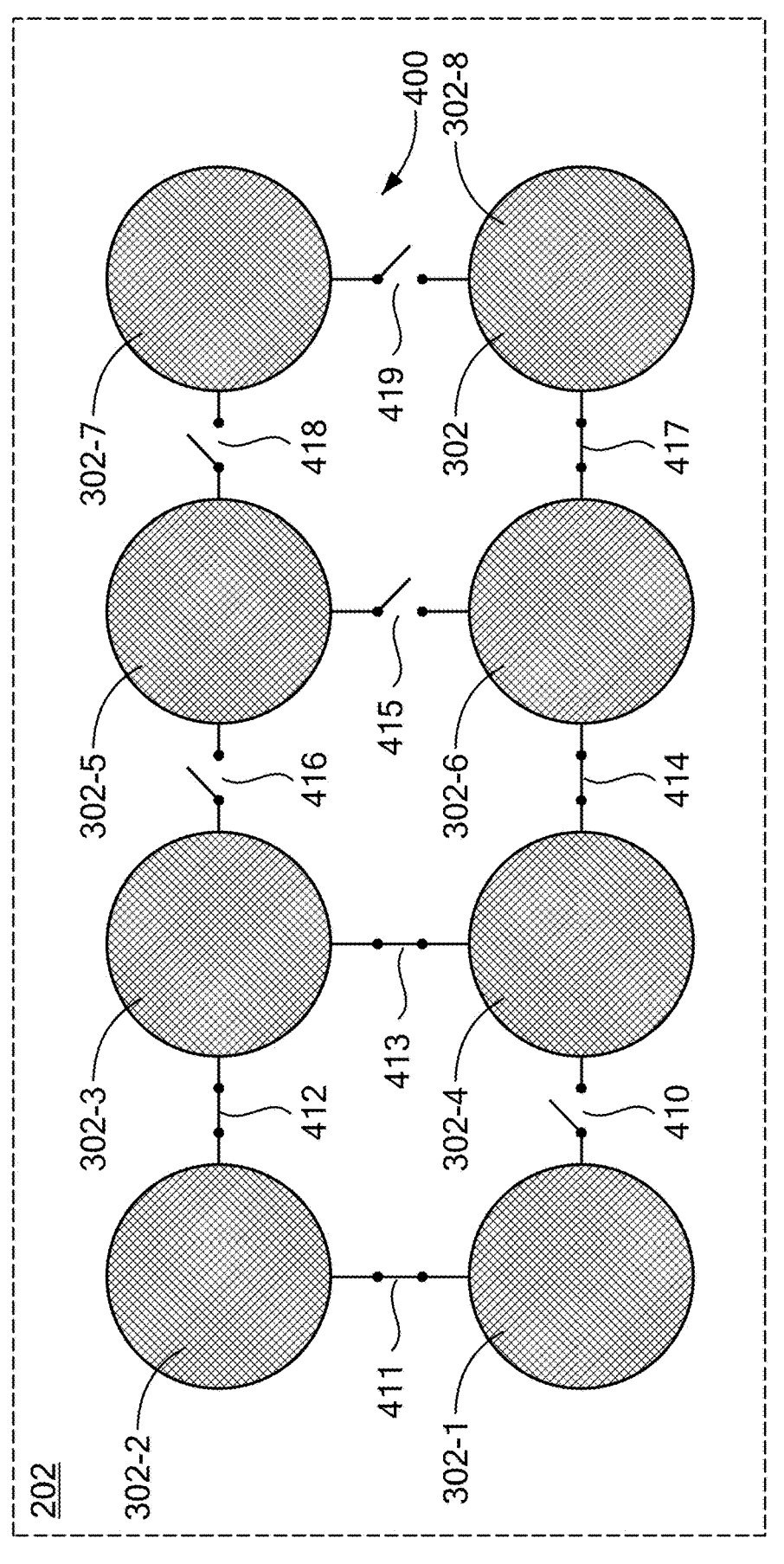
FIG. 4C is a diagram of a sensing element portion, according to aspects of the disclosure.

FIG. 4C is a diagram of TMR portion 400 in accordance with another implementation. In the example of FIG. 4C, pillars 302-1 through 302-8 are interconnected with switches 410-419. Switches 410-419 may be part of switching matrix 201. In the example of FIGS. 4C, switches 411, 412, 413, 414, and 417 are turned on, while switches 410, 416, 415, 418, and 419 are turned off. As a result of this arrangement, pillars 302-5 and 302-7 are offline, and pillars 302-1, 302-2, 302-3, 302-4, 302-6, and 302-8 are online. In the example of FIG. 4C, the individual resistances of pillars 302-1, 302-2, 302-3, 302-4, 302-6, and 302-8 contribute to the total resistance of TMR portion 400 and/or TMR 202. In the example of FIG. 4C, the individual resistances of pillars 302-5 and 302-7 do not contribute to the total resistance of TMR portion 400 and/or TMR 202. In the example of FIG. 4C, the total resistance of TMR portion 400 is equal to the sum of the individual resistances of the pillars 302-1, 302-2, 302-3, 302-4, 302-6, and 302-8 (because they are connected in series). If some of pillars 302-1, 302-2, 302-3, 302-4, 302-6, and 302-8 were to be connected in parallel, the total resistance of TMR portion 400 may be calculated differently.

In one respect, FIG. 4C is provided to illustrate another example of a topology for the switches in switching matrix 201.

As noted above, a pillar is offline, when the individual resistance of the pillar does not contribute to the total resistance of the TMR of which the pillar is part. Similarly, a pillar is online when the individual resistance of the pillar contributes to the total resistance of the TMR, which the pillar is part of. In the example of FIG. 3, the total resistance of TMR 202 is the resistance between nodes 312 and 314. As illustrated in FIGS. 4B and 4C, bringing offline any of the pillars 302 in TMR 202 may include configuring one or more of the switches in switching matrix 201 to bypass the TMR. Similarly, bringing online any of the pillars 302 in TMR 202 may include configuring any of the switches in switching matrix 201 so that electrical current must flow through the TMR. It will be understood that the present disclosure is not limited to any specific topology for the switches in a switching matrix and/or the pillars in a TMR. Those of ordinary skill in the art will readily recognize, after reading the present disclosure, that there may be a large number of different topologies that would allow pillars in a TMR to be brought online or offline. In some implementations, switching matrix 201 may be configured to bring online or offline (in response to the appropriate control signal from matrix controller 205) any given pillar in TMR 202. Alternatively, in some implementations, matrix controller 205 may be configured to bring online or offline (in response to the appropriate control signal from matrix controller 205) fewer than all pillars in TMR 202. In this case, some of the pillars in TMR 202 may be permanently online, while the rest are able to alternate between being online or offline depending on the state of switching matrix 201.

In one example, switches 410, 416, and 417 may be turned off, and switches 411, 412, 413, 414, 415, 418, and 419 may be turned on. When this is the case, all of pillars 302-1, 302-2, 302-3, 302-4, 302-5, 302-6, 302-7, and 302-8 would be online. If pillar 302-5 were to be brought offline, this could involve turning off switches 415, 416, and 418 and turning on switch 417 to connect pillars 302-7 and 302-8 with the circuit portion including pillars 302-1, 302-2, 302-3, 302-4, and 302-6. In this instance, the set of pillars 302-7 and 302-8 and the set of pillars 302-1, 302-2, 302-3, 302-4, 302-5, and 302-6 are examples of circuit portions that remain after pillar 302-7 is disconnected.

Figure 5:
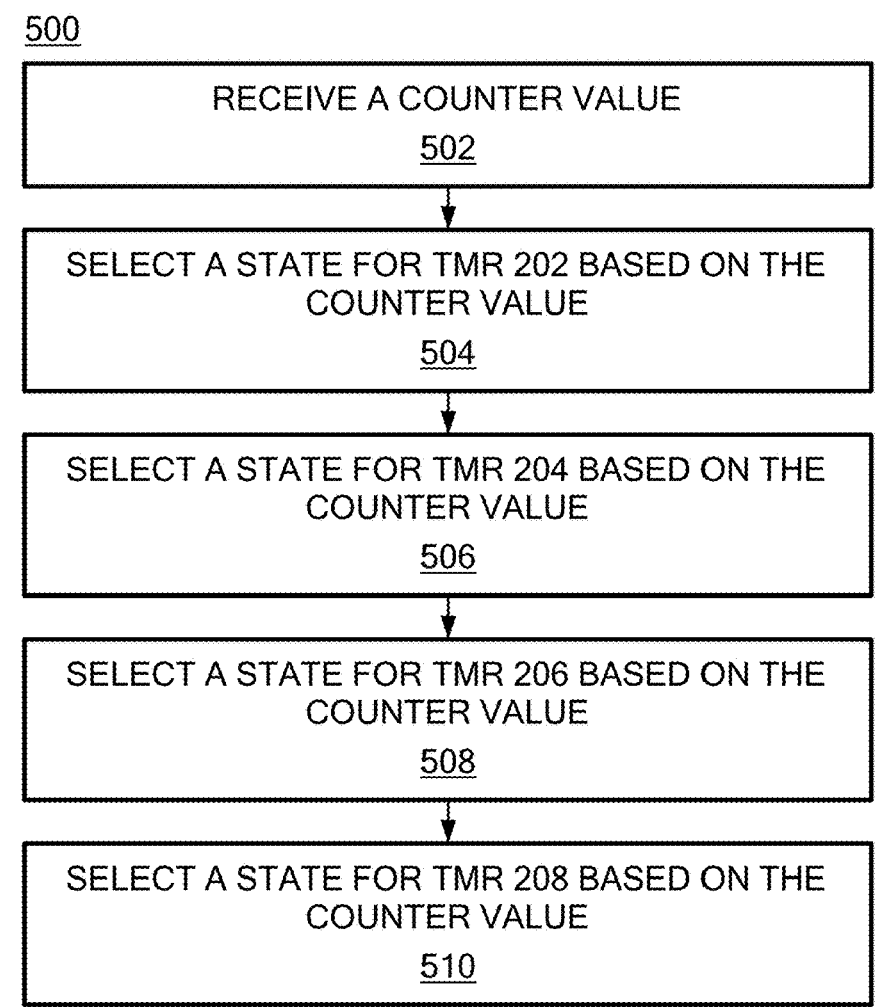
FIG. 5 is a flowchart of an example of a process, according to aspects of the disclosure.

FIG. 5 is a diagram of an example of a process 500, according to aspects of the disclosure. According to the present example, process 500 is performed by matrix controller 205. However, the present disclosure is not limited to any specific entity performing the process 500.

At step 502, matrix controller 205 receives a counter value. The counter value may be the current value of signal COUNT, which is discussed above with respect to FIG. 1A. It will be recalled that signal COUNT is generated by autozero circuit 135.

At step 504, matrix controller 205 selects a state for TMR 202 based on the current value of signal COUNT. The selected state may be the same or different from the current state of TMR 202. When the selected state is different from the current state, matrix controller 205 causes TMR 202 to transition from its current state to the selected state. The transition may be effectuated by at least one of: (i) bringing online one or more pillars 302 that are part of TMR 202 and/or (ii) bringing offline one or more pillars 302 that are part of TMR 202. When the selected state is the same as the current state of TMR 202, matrix controller 205 may do nothing (because the two states are the same anyway). Additionally or alternatively, in some implementations, step 504 may be executed by (i) identifying a control code for TMR 202 based on the current value of signal COUNT and (ii) applying the control code to TMR 202. The application of the control code to TMR 202 may result in a change of the state of the TMR 202 (if the control code corresponds to a state different than the current state of TMR 202), or it can result in no change of the state of TMR 202 (if the control code corresponds to a state that is the same as the current state of TMR 202).

At step 506, matrix controller 205 selects a state for TMR 204 based on the current value of signal COUNT. The selected state may be the same or different from the current state of TMR 204. When the selected state is different from the current state, matrix controller 205 causes TMR 204 to transition from its current state to the selected state. The transition may be effectuated by at least one of: (i) bringing online one or more pillars 302 that are part of TMR 204 and/or (ii) bringing offline one or more pillars 302 that are part of TMR 204. When the selected state is the same as the current state of TMR 204, matrix controller 205 may do nothing (because the two states are the same anyway). Additionally or alternatively, in some implementations, step 506 may be executed by (i) identifying a control code for TMR 204 based on the current value of signal COUNT and (ii) applying the control code to TMR 204. The application of the control code to TMR 204 may result in a change of the state of the TMR 204 (if the control code corresponds to a state different than the current state of TMR 204), or it can result in no change of the state of TMR 204 (if the control code corresponds to a state that is the same as the current state of TMR 204).

At step 508, matrix controller 205 selects a state for TMR 206 based on the current value of signal COUNT. The selected state may be the same or different from the current state of TMR 206. When the selected state is different from the current state, matrix controller 205 causes TMR 206 to transition from its current state to the selected state. The transition may be effectuated by at least one of: (i) bringing online one or more pillars 302 that are part of TMR 206 and/or (ii) bringing offline one or more pillars 302 that are part of TMR 206. When the selected state is the same as the current state of TMR 206, matrix controller 205 may do nothing (because the two states are the same anyway). Additionally or alternatively, in some implementations, step 508 may be executed by (i) identifying a control code for TMR 206 based on the current value of signal COUNT and (ii) applying the control code to TMR 206. The application of the control code to TMR 206 may result in a change of the state of the TMR 206 (if the control code corresponds to a state different than the current state of TMR 206), or it can result in no change of the state of TMR 206 (if the control code corresponds to a state that is the same as the current state of TMR 206).

At step 510, matrix controller 205 selects a state for TMR 208 based on the current value of signal COUNT. The selected state may be the same or different from the current state of TMR 208. When the selected state is different from the current state, matrix controller 205 causes TMR 208 to transition from its current state to the selected state. The transition may be effectuated by at least one of: (i) bringing online one or more pillars 302 that are part of TMR 208 and/or (ii) bringing offline one or more pillars 302 that are part of TMR 208. When the selected state is the same as the current state of TMR 208, matrix controller 205 may do nothing (because the two states are the same anyway).

Additionally or alternatively, in some implementations, step 510 may be executed by (i) identifying a control code for TMR 208 based on the current value of signal COUNT and (ii) applying the control code to TMR 208. The application of the control code to TMR 208 may result in a change of the state of the TMR 208 (if the control code corresponds to a state different than the current state of TMR 208), or it can result in no change of the state of TMR 208 (if the control code corresponds to a state that is the same as the current state of TMR 208).

FIG. 5 is provided as an example only. At least some of the steps in process 500 may be performed in a different order, in parallel, or altogether omitted. Although in the example of FIG. 5, the state of each element in sensing bridge 132 is set, alternative implementations are possible in which the states of fewer than all of the sensing elements in sensing bridge 132 are set. In some implementations, at least one of steps 504-510 may be omitted.

Figure 6:
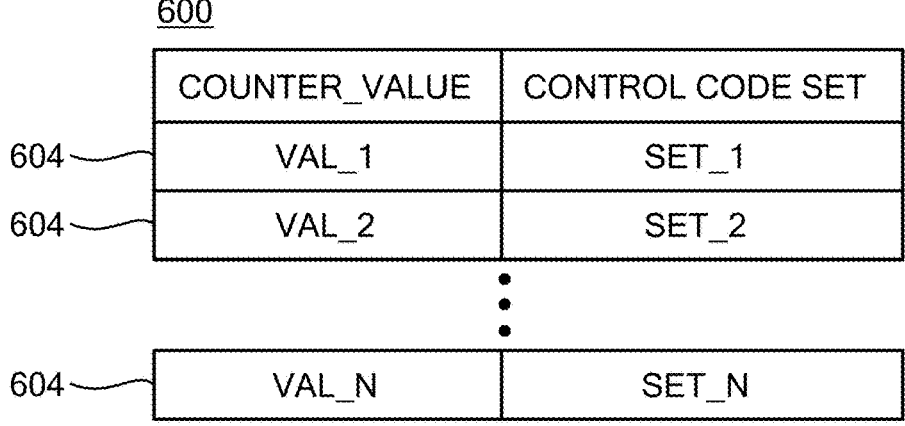
FIG. 6 is a diagram of an example of a data structure, according to aspects of the disclosure.

FIG. 6 is a diagram of an example of a data structure 600, according to aspects of the disclosure. As illustrated, data structure 600 may include a plurality of entries 604. Each entry 604 may include: (i) an indication of a value of the signal COUNT, and (ii) an indication of a control code set that corresponds to the value of signal COUNT. In other words, data structure 600 is used to index different control code sets to different values of signal COUNT (or to different numerical identifiers). Each entry 604 in data structure 600 may include a different value of signal COUNT. Furthermore, in some implementations, each entry in data structure 600 may include a different control code set.

The control code set in any of entries 604 may include a plurality of control codes. The plurality of control codes may be concatenated into a single word or they may be provided as separate words. The plurality of control codes may include a first control code corresponding to TMR 202, a second control code corresponding to TMR 204, a third control code corresponding to TMR 206, and a fourth control code corresponding to TMR 208. Although, in the present example, each control code set includes control codes for each of the TMRs in sensing bridge 132, alternative implementations are possible in which each control code set includes control codes for fewer than all TMRs in sensing bridge 132.

An example of a control code is now provided in further detail. As noted above, a given TMR may include a set of one or more pillars that are capable of being brought online and offline. Each pillar in the set may be associated with one or more switches that determine whether the pillar is online or offline. The entire set of pillars may thus be associated with a set of switches, wherein, for any given pillar in the set of pillars, the set of switches includes one or more switches that determine whether the pillar is offline. The control code may include a plurality of bits, where each bit corresponds to a different switch in the set of switches. For example, the first bit in the control code may correspond to a first switch in the set of switches, the second bit in the control code may correspond to a second switch in the set of switches, the third bit in the control code may correspond to a third switch in the set of switches, and so forth. The value of each bit in the control code determines whether the bit's corresponding switch should be turned off or on. For example, if a bit in the control code has the value of '1', this means that the bit's corresponding switch should be turned on. If the same bit has the value of '0', this means that the bit's corresponding switch should be turned off. Applying the control code to the given TMR thus means switching on or off each of the switches in the set as specified by the switch's corresponding bit. As can be readily appreciated, bringing online (or offline) one or more pillars in a TMR may change the total resistance of the TMR.

Steps 504-510 involve selecting a state for each of TMRs 202-208. As noted above, selecting a state for each of TMRs 202, 204, 206, and 208 may involve using the value of signal COUNT (received at step 502) to perform a search of data structure 600, and retrieve a control code set as a result of the search. The retrieved control code set may be mapped to the value of signal COUNT by data structure 600. After the control code set is retrieved, each control code in the set may be applied to the control code's corresponding TMR.

FIG. 6 is provided to illustrate one possible way in which different control codes (or control code sets) could be indexed to corresponding numerical identifiers. The present disclosure is not limited to any specific method for identifying a control code based on a numerical identifier (which is represented by the value of signal COUNT). For example, in some implementations, the indexing of control codes to corresponding numerical identifiers may be implemented by using digital logic. As another example, the counter values (shown in entries 604) may be specified implicitly by the ordering in which the sets of control codes are stored in a memory (or memory block). As yet another example, the use of control codes may be omitted, and instead, the matrix controller 205 may use digital logic to gate the state of the switches in switching matrices 201 and 203 to the values of signal COUNT. Stated succinctly, the present disclosure is not limited to any specific method for associating the value of signal count to a corresponding state of each of a plurality of switches.

Although data structure 600 is depicted as a table, the present disclosure is not limited to any specific implementation of data structure 600. For example, data structure 600 may be implemented as a set of 2-element arrays that are completely independent of each other, as a search tree, and/or in any other suitable manner. As used throughout the disclosure, the term "data structure" may refer to one or more memory locations, which may or may not be contiguous.

Figure 7:
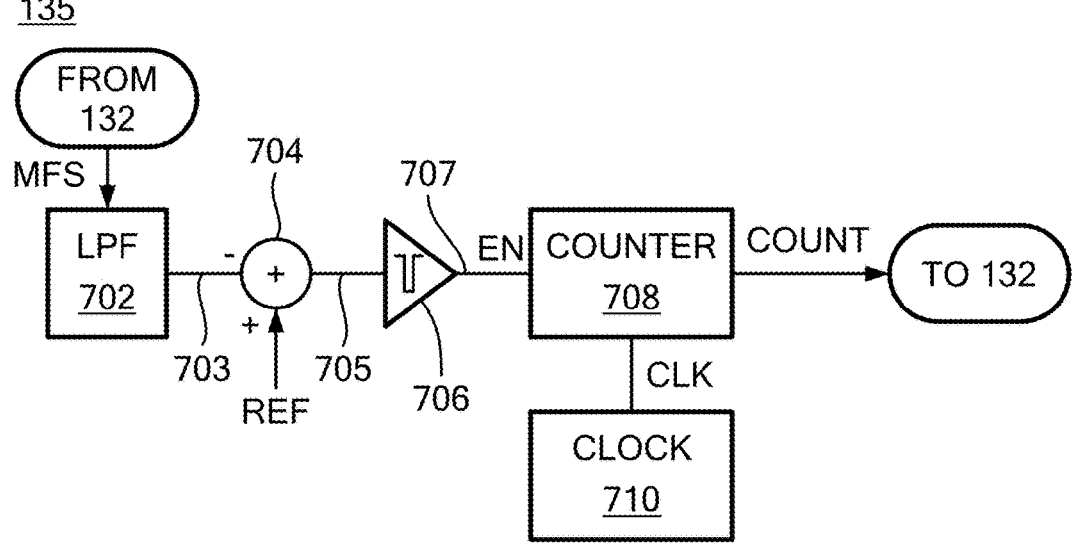
FIG. 7 is a diagram of an example of an autozero circuit, according to aspects of the disclosure.

FIG. 7 is a diagram of the autozero circuit 135, according to aspects of the disclosure. As illustrated, autozero circuit 135 may include a low-pass filter (LPF) 702, an addition unit 704, a counter 708, and a clock 710. Low-pass filter 702 may receive the signal $V_i$ from sensing bridge 132. In one example, signal $V_i$ may be a differential signal having components VOUT_1 and VOUT_2 (shown in FIG. 2), and it may be a high frequency signal that is modulated at the first frequency F1. (See FIG. 1A.) As discussed above with respect to FIG. 1A, signal $V_i$ may be an alternating current (AC) signal. Additionally or alternatively, in some implementations, signal $V_i$ may be a signal that is generated in response to a magnetic field produced by a rotating target or an electrical conductor having electrical current running therethrough. LPF 702 may filter signal $V_i$ to extract a direct current (DC) offset 703 that is present in signal $V_i$. In one implementation, LPF 702 may have a cutoff frequency F2 that is less than the first frequency F1, so that the LPF 702 would pass through all (or at least some) frequencies that are less than or equal to the first frequency F1. The first frequency F1 is discussed above with respect to FIG. 1A.

Addition unit 704 may add a value of REF to the offset 703, and output a signal 705 to comparator 706. According to the present example REF=0, and the value of signal 705 is the same as the value of signal 703. However, alternative implementations are possible in which REF has a non-zero value, in which case the value of signals 705 would be equal to the sum of signal 705 and signal REF. Under the nomenclature of the present disclosure, each of signals 705 and 703 may be referred to as an offset signal (or offset). Although, in the present example, signals 703 and 705 are generated using a low-pass filter, alternative implementations are possible when signals 703 and 705 are generated using a band-pass filter and/or any other suitable type of filter. Signals 703 and 705 represent a DC offset that is present in signal $V_i$. The offset may be caused by the presence of stray fields combined with a resistive imbalance in sensing bridge 132.

Comparator 706 may be any suitable type of comparator, such as a window comparator, a Schmitt trigger, or a single-threshold comparator. Comparator 706 may determine whether the value of signal 705 is within predetermined bounds. Determining whether signal 705 is within predetermined bounds may include detecting whether signal 705 is greater than a threshold T1 and smaller than a threshold T2. If signal 705 is greater than threshold T1 and smaller than threshold T2, signal 705 may be said to be within the predetermined bounds. Otherwise, if signal 705 is smaller than or equal to threshold T1 or greater than or equal to threshold T2, signal 705 may be said to be outside of the predetermined bounds. In another example, determining whether signal 705 is within predetermined bounds may include detecting whether the value of signal 705 is smaller than a threshold T3. If the value of signal 705 is smaller than threshold T3, signal 705 may be said to be within the predetermined bounds. If the value of signal 705 is greater than or equal to threshold T3, signal 705 may considered outside of the predetermined bounds.

Comparator 706 may output a signal 707. Specifically, comparator 706 may set the value of signal 707 to '1' when the value of signal 705 is within the predetermined bounds. On the other hand, if the value of signal 705 is outside of the predetermined bounds, comparator 706 may set the value of signal 707 to '0'. In the present example, signal 707 is used to enable or disable counter 708. In the present example, when signal 707 is set to '1', counter 708 is enabled. When signal 707 is set to '0' counter 708 is disabled.

Clock 710 is used to drive counter 708 with a clock signal CLK. When counter 708 is enabled, the output of counter 708 is incremented in each cycle of signal CLK until a maximum value is reached, at which time the output of counter 708 is rolled back to an initial value. On the other hand, when counter 708 is disabled, the output of counter 708 stays the same. The output of counter 708 is the signal COUNT which is discussed above with respect to FIGS. 1A and 5. Under the present arrangement, the value of signal COUNT would be updated every time the value of signal 705 is outside of the predetermined bounds. In some implementations, matrix controller 205 may monitor whether the value of signal COUNT is updated, and execute process 500 if and only if the value of signal COUNT is updated.

In some respects, the system discussed with respect to FIGS. 1A-7 may be used to correct a resistive imbalance between TMRs 202, 204, 206, and 208. A resistive imbalance may result in an imbalance of sensing bridge 132 and a degraded common mode response or rejection ratio (CMRR). Moreover, it can result in a ripple (e.g., modulated offset) that cannot be removed by amplifier 140, and is thus propagated in the output of amplifier 140 (e.g., see FIG. 1A). The ripple may result from sensing bridge 132 being subjected to stray fields while experiencing a resistive imbalance. The process discussed with respect to FIGS. 5-7 is advantageous because prevents such a ripple from being propagated and thus improves the accuracy of magnetic field sensor 100. If the ripple is not eliminated, this would create an excessive current consumption through secondary coil 106 (shown in FIG. 1A), which would increase the residual offset in magnetic field sensor 100. The excessive current consumption may result from the ripple being fed back into the secondary coil 106. The use of autozero circuit 135 does not have an associated noise penalty. Specifically, the use of autozero circuit 135 may lead to increased noise in the low-frequency band (i.e., a band below modulating frequency F1), but this would not affect negatively the operation of magnetic field sensor 100 because the useful signal lives in a high-frequency band (e.g., a band centered on frequency F1, etc.). In general, the use of autozero circuit 135 leads to improved CMRR and increased stray field immunity. As will be described below however, additional improvement in CMRR and stray field immunity can be provided by embodiments described in connection with FIGS. 8-14.

The phrase "two TMRs have the same resistance," as used throughout the disclosure shall mean that the two TMRs will exhibit the same resistance when they are exposed to the same magnetic field (or when the two TMRs experience the same density and direction of magnetic flux). The phrase "two TMRs have different resistances," as used throughout the disclosure shall mean that the two TMRs will exhibit different resistances when they are exposed to the same magnetic field (or when the two TMRs experience the same density and direction of magnetic flux). Two resistances may be considered the same when the difference between the resistances is smaller than a threshold value. On the other hand, two resistances may be considered different when the difference between the two resistances is greater than the threshold value. As can be readily appreciated, in practice, it may be impossible for the resistances of two TMRs to be exactly the same due to manufacturing tolerances or other similar factors.

In one respect, the process discussed with respect to FIGS. 1A-7 involves matrix controller 205 cycling through a different set of control codes every time a low-frequency component in the output of sensing bridge 132 is out of bounds until a set of control codes is applied to the TMRs in sensing bridge 132 which leads to the low-frequency components staying within the predetermined bounds. Each set of control codes is indexed to a different value of the signal COUNT. The indexing may be performed by using a data structure, digital logic, and/or any other suitable manner. The value of signal count is updated (e.g., incremented) when the low-frequency component is found to be out of bounds. The value of signal count may not be updated (i.e., it may stay the same) when the low-frequency component is within the bounds. At the very least, every time a new set of control codes is applied to the TMRs in sensing bridge 132, at least one pillar 302, in at least one of TMRs 202, 204, 206, and 208, would be brought either online or offline, which in turn changes the total resistance of the TMR of which the pillar 302 is part. When the low-frequency component is in-bounds, this means that the resistances of the TMRs in sensing bridge 132 are substantially balanced. When the low-frequency component is out-of-bonds, this could mean that sensing bridge 132 is experiencing a restive imbalance caused by at least one of the TMRs in sensing bridge 132 having a resistance that is greater (by a predetermined threshold) than the resistance of another one of the TMRs in sensing bridge 132.

The concepts and ideas presented throughout the disclosure are not limited to TMRs or magnetic field sensors. The concepts and ideas presented throughout the disclosure can be applied to any resistive-type sensor that includes a plurality of resistive-type sensing elements, where each sensing element is formed of sub-units coupled in series (or in parallel, etc.). In general, a resistive-type sensing element may be any sensing element whose resistance changes in response to changes in a stimulus. Examples of resistive-type sensing elements include a strain gauge, a thermistor, a light-dependent resistor (LDR), a humidity sensing element, a gas sensor, a force-sensitive resistor, or a flex-sensor. A resistive-type sensing element may include a circuit comprising a plurality of individual sensing elements. For example, a thermistor may include a series of thermistors (i.e., resistive elements) that are arranged to function collectively as a unified thermistor. A force-sensitive resistor may include a circuit of force-sensitive resistors (i.e., resistive elements) that are arranged to function collectively as a unified force-sensitive resistor. A strain gauge element may include a circuit of strain gauge elements (i.e., resistive elements) that are arranged to function collectively as a unified strain gauge element. A photoresistor may include a circuit of photoresistors (i.e., resistive elements) that are arranged to function collectively as a unified photoresistor. A humidity sensing element may include a circuit of humidity sensing elements (i.e., resistive elements) that are arranged to function collectively as a unified humidity sensing element. A gas-sensing element may include a circuit of gas-sensing elements (i.e., resistive elements) that are arranged to function collectively as a unified big gas-sensing element. A flex sensor may include a plurality of flex sensors (i.e., resistive elements) that are arranged to function collectively as a unified flex sensor. In the discussion with respect to FIGS. 1A-7, TMR 202 is an example of a "unified sensing element" that is composed of multiple smaller constituent sensing elements that have the same functionality. As discussed above, TMR 202 is composed of multiple pillars that each have a resistance which changes when the pillar is subjected to a magnetic field.

Although, in the example of FIGS. 1A and 1B, magnetic field sensor 100 is a closed loop system, it will be understood that the concepts and ideas presented throughout the disclosure can be used in open-loop systems, as well, and in particular open-loop systems that are configured to sense high-frequency magnetic fields.

As noted above, the system discussed with reference to FIGS. 1A-7 corrects resistive imbalance or mismatch amongst TMRs 202, 204, 206, and 208 by using such TMRs as DAC unit cells. By "DAC unit cells" it is meant that one or more TMR 202, 204, 206, and 208 can produce a quantized, discrete resistance level step under the control of an input code by which unit cells (e.g., dots or pillars) are brought online and offline (i.e., coupled and decoupled from the respective TMR). Since TMRs 202, 204, 206, and 208 contain multiple pillars, or dots, this methodology for removing resistive mismatch can be referred to as using "dot-based DACs".

Resistive imbalance amongst TMRs 202, 204, 206, and 208 creates a DC imbalance, or offset having an associated drift (e.g., a drift over environmental condition changes over time like temp, humidity, stress, etc.) and also degrades CMRR performance of the system, thus degrading stray field immunity. Stated differently, a DC imbalance in the sensing bridge 132 results in two undesirable effects; namely a DC shift or offset on the bridge output (which can be removed with the above-described dot-based DAC arrangement of FIGS. 1A-7 by effectively centering the DC offset around zero) and also common mode rejection degradation.

In addition to being affected by DC offset, common mode performance is also affected by any sensitivity mismatches amongst the elements of the sensing bridge. Stated differently, CMRR degradation is attributable to both DC offset and sensitivity mismatch. Thus, although the offset aspect of common mode rejection degradation is addressed by the system of FIGS. 1A-7, there can be another (DC or AC) component to common mode performance whereby an undesirable DC or AC differential output of the sensing bridge results. For example, in the presence of an DC or AC stray field (e.g., a 1 KHz stray field), even with the resistive mismatch amongst the TMRs 202, 204, 206, and 208 removed, the DC or AC stray field may result in a differential bridge output at the frequency of the stray field. Thus, although the above-described dot-based DAC approach resolves any bridge offset and thus, can partially address CMRR degradation, it may not entirely address CMRR degradation of the bridge.

Figure 8:
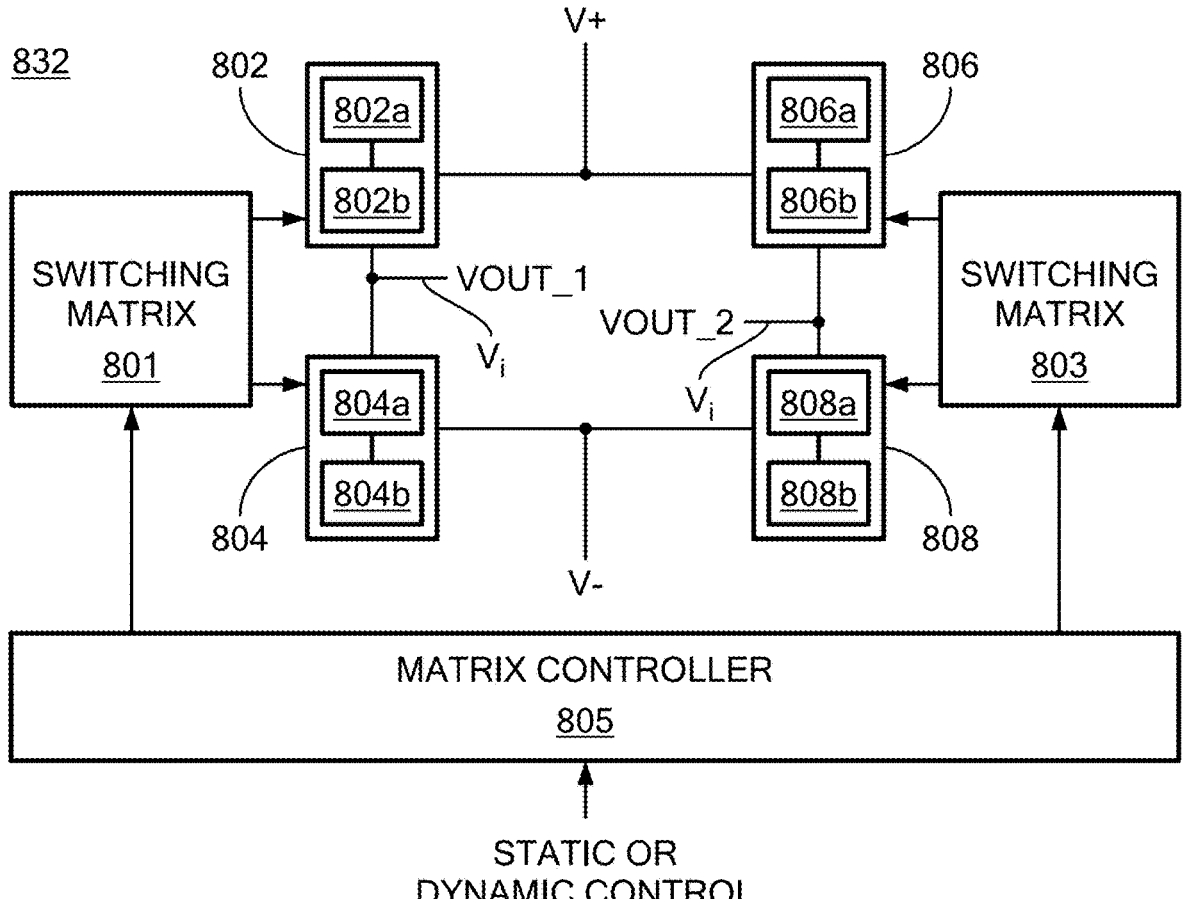
FIG. 8 is a diagram of another example sensing bridge, according to aspects of the disclosure.
Figure 8A:
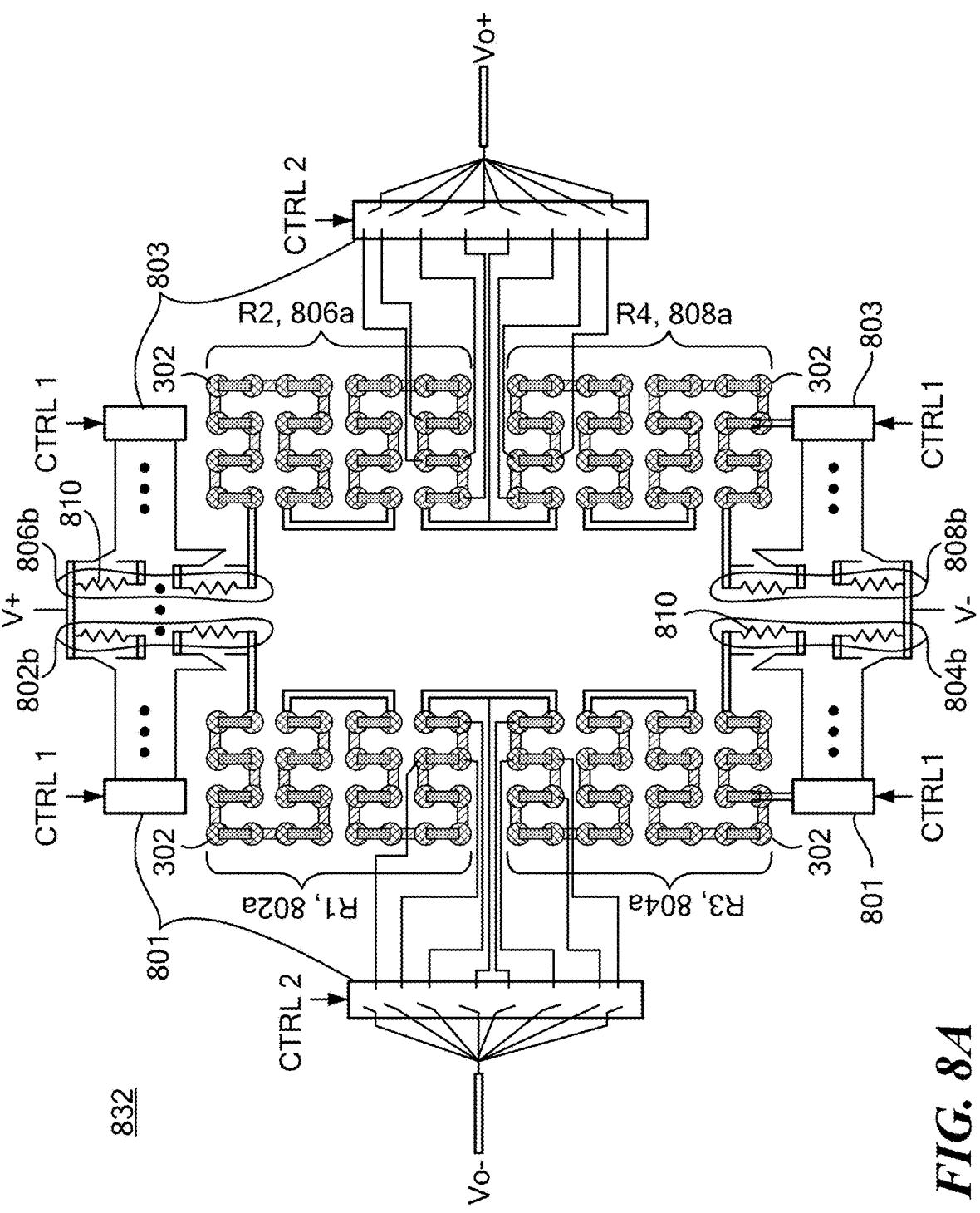
FIG. 8A is a diagram of an example of a sensing bridge of the type shown in FIG. 8, according to aspects of the disclosure.

Referring to FIGS. 8 and 8A, according to a further aspect of the disclosure, an alternative sensing bridge 832 can include passive resistors configured as DACs. As will be described, use of passive resistors as DACs can address CMRR degradation attributable to offset in a more efficient manner than dot-based TMR DACs. Additionally, unlike dot-based TMR DACs, passive resistor-based DACs can address CMRR degradation attributable to sensitivity mismatch amongst the bridge elements because (unlike TMR elements), passive resistors are independent of (i.e., unaffected by) common mode fields.

Bridge 832 includes bridge legs 802, 804, 806, 808, switching matrices 801 and 803, and a matrix controller 805 and can be used in place of bridge 132 in FIG. 1A or 1B for example.

Bridge 832 differs from bridge 132 (FIGS. 1A, 1B, 2 and 3) in that each bridge leg 802, 804, 806, 808 can include one or more than one type of resistive element. For example, each leg 802, 804, 806, 808 can include a respective TMR element 802a, 804a, 806a, 808a, each including a plurality of pillars, or dots, and a respective passive resistor 802b, 804b, 806b, 808b, each including a plurality of passive resistor unit cells. Alternatively, fewer than all four bridge legs 802, 804, 806, 808 can include both a TMR element and a passive resistor (e.g., see FIG. 9).

By "passive resistor" it is meant that resistors 802b, 804b, 806b, 808b are not responsive to magnetic fields. Example passive resistors can be standard resistors, such as poly resistors.

Switching matrix 801 can be configured to switch bridge legs 802 and 804. However, alternative implementations are possible in which a different switching matrix is provided for each bridge leg 802 and 804. Similarly, switching matrix 803 can be configured to switch bridge legs 806 and 808. However, alternative implementations are possible in which a different switching matrix is provided for each bridge leg 806 and 808. Although, in the present example, switching matrix 801 and switching matrix 803 are depicted as separate elements, alternative implementations are possible in which they are integrated with each other.

Switching matrix 801 may include a plurality of switches that are configured to connect or disconnect dots in one of TMRs 802a, 804a from the rest of the dots in the same TMR. Switching matrix 801 may additionally include switches that are configured to connect or disconnect passive resistor unit cells in one of passive resistors 802b, 804b from the rest of the passive resistor unit cells in the same resistor. Similarly, switching matrix 803 may include a plurality of switches that are configured to connect or disconnect dots in one of the TMRs 806*a*, 808*a* from the rest of the dots in the same TMR. Switching matrix 803 may additionally include switches that are configured to connect or disconnect passive resistor unit cells in one of passive resistors 806*b*, 808*b* from the rest of the passive resistor unit cells in the same resistor. Although, in the present example, switching matrix 801 is described as connecting or disconnecting dots of both TMRs 802*a*, 804*a* and also unit cells of passive resistors 802*b*, 804*b*, it will be appreciated that matrix 801 can include multiple matrices, each configured to connect or disconnect only dots of TMR elements 802*a*, 804*a* or only passive resistor unit cells of passive resistors 802*b*, 804*b* rather than both. Similarly, although, in the present example, switching matrix 803 is described as connecting or disconnecting dots of both TMRs 806*a*, 808*a* and also unit cells of passive resistors 806*b*, 808*b*, it will be appreciated that matrix 803 can include multiple matrices, each configured to connect or disconnect only dots of TMR elements 806*a*, 808*a* or only passive resistor unit cells of passive resistors 806*b*, 808*b* rather than both.

Matrix controller 805 may include any suitable type of circuitry that is configured to switch on and off each (or at least some) of the switches in switching matrices 801 and 803. By way of example, matrix controller 805 may include a general-purpose processor, a special-purpose processor, an application-specific circuit, and/or any other suitable type of processing circuitry. In one example, matrix controller 805 may be configured to perform a process similar to the process of FIG. 5 by which states for TMR elements 802*a*, 804*a*, 806*a*, 808*a* and states for passive resistors 802*b*, 804*b*, 806*b*, 808*b* are selected. In some implementations, matrix controller 805 may be provided separately from sensing bridge 832. Additionally, or alternatively, in some implementations, matrix controller 805 may be integrated in other sensor circuitry.

Referring also to FIG. 8A, bridge 832 is shown in greater detail, and including features by which the bridge can have adjustable TMR elements 802*a*, 804*a*, 806*a*, 808*a* and also adjustable passive resistors 802*b*, 804*b*, 806*b*, 808*b* as may be included in a bridge of the general type shown in FIG. 8. More particularly, passive resistors 802*b*, 804*b*, 806*b*, 808*b* can be used as DAC unit cells since they can produce a quantized, discrete resistance level step under the control of an input code by which unit cells (e.g., passive resistor unit cells) are brought online and offline (i.e., coupled and decoupled from the respective passive resistor). Since passive resistors 802*b*, 804*b*, 806*b*, 808*b* contain passive resistor unit cells, this methodology can be referred to as using "passive resistor-based DACs".

Figure 12:
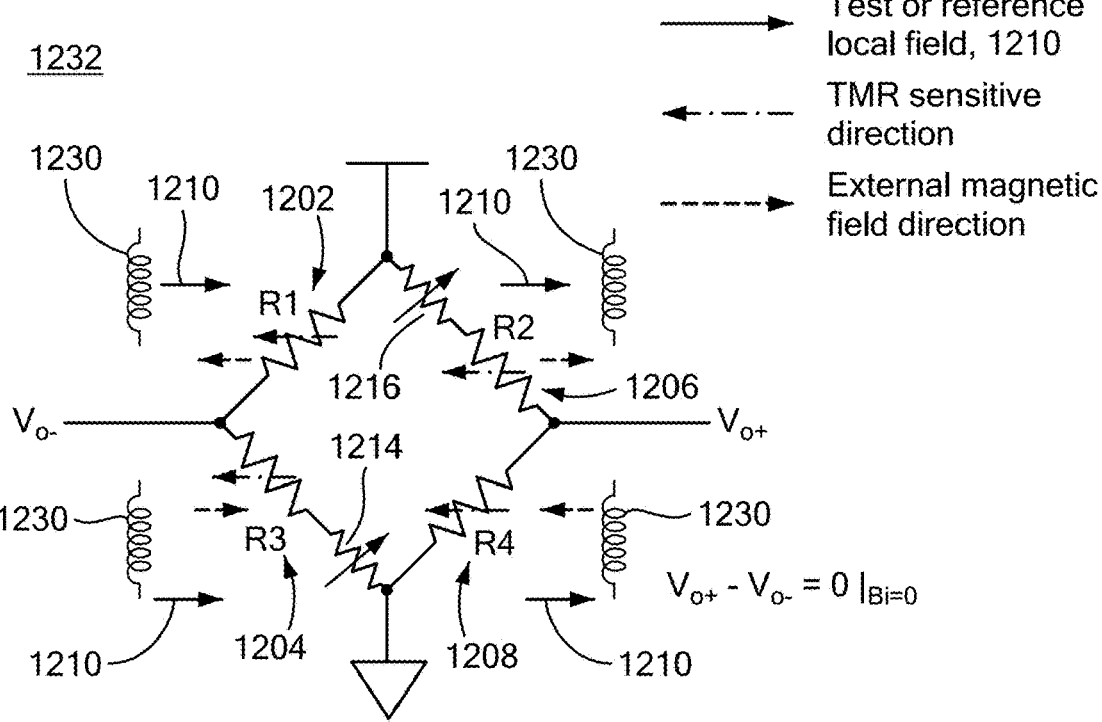
FIG. 12 is a diagram of another example sensing bridge, according to aspects of the disclosure.
Figure 13:
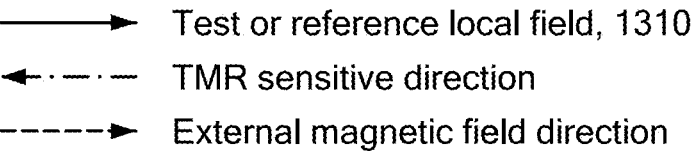
FIG. 13 is a diagram of yet another sensing bridge, according to aspects of the disclosure.
Figure 13:
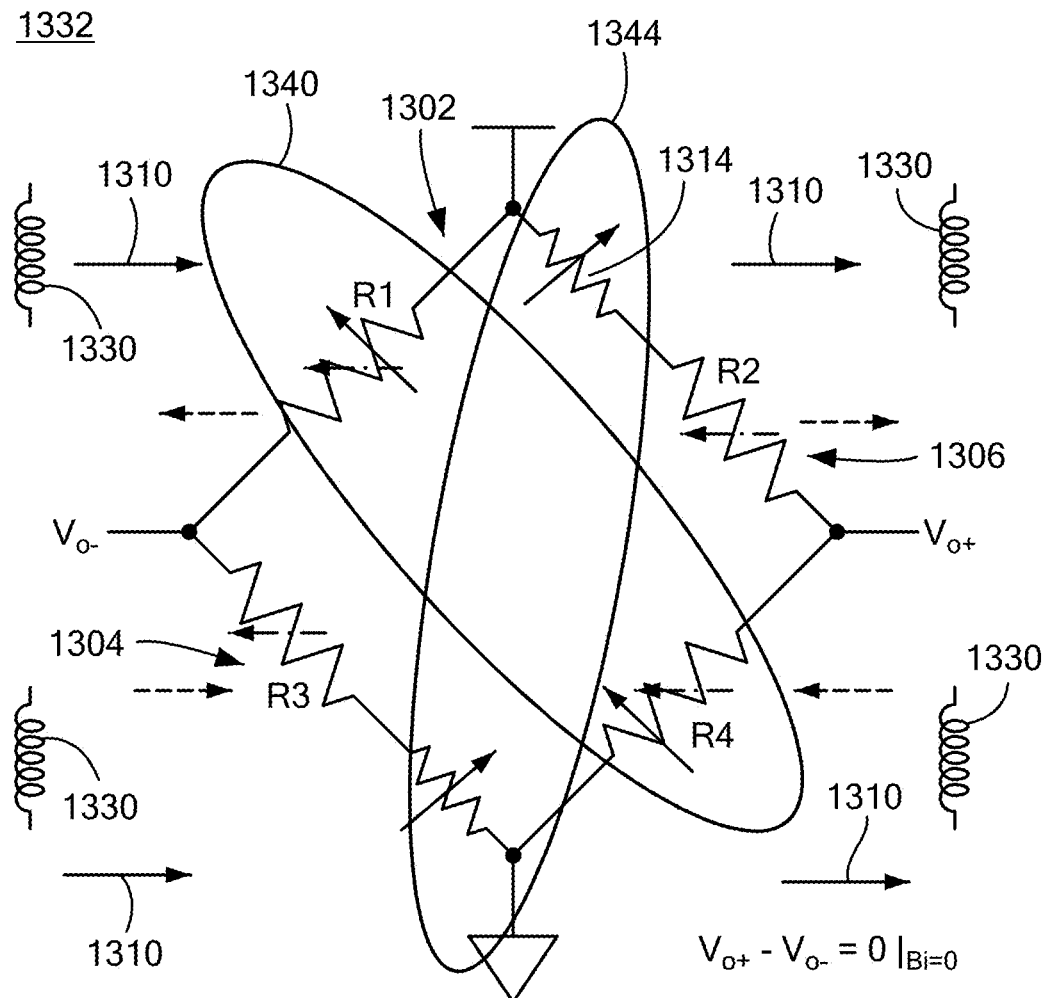

It will be appreciated that in some embodiments, only one or more passive resistors are adjustable (see FIGS. 9 and 12), in some embodiments only one or more TMR elements are adjustable (see FIGS. 3 and 11), and in some embodiments both one or more passive resistors and also one or more TMR elements are adjustable (see FIG. 13). For example, in some applications it is desirable to have only the DC offset amongst bridge legs balanced as can be achieved with dot-based DACs, in some applications it is desirable to have only CMRR degradation addressed as can be achieved with passive resistor-based DACs, and in some applications, it is desirable to combine both dot-based DACs with passive resistor-based DACs in order to thereby address both DC offset and CMRR degradation.

As illustrated, each of TMRs 802*a*, 804*a*, 806*a*, 808*a* includes a plurality of pillars or dots 302 that can be the same as or similar to pillars 302 in FIG. 3. As further detailed in FIGS. 4A, 4B, and 4C, the pillars 302 in each of TMRs

802*a*, 804*a*, 806*a*, and 808*a* may be connected in series with each other with the connection accomplished using conductors (e.g., conductive traces) that connect the respective tops and bottoms of adjacent pillars. Each of the pillars in any of TMRs 802*a*, 804*a*, 806*a*, 808*a* may have the same resistance or, alternatively may have different resistances.

As described above in connection with FIG. 3, the dot-based DACs provided by the illustrated arrangement of TMRs 802*a*, 804*a*, 806*a*, 808*a* can be controlled by providing one or more a programmable taps with which pillars 302 can be brought online or offline to achieve a desired total resistance for each TMR. Such control of the resistance of dot-based DACs 802*a*, 804*a*, 806*a*, 808*a* can be achieved under the control of a CTRL 2 signal with which taps are selectively coupled to the bridge output terminals Vo−, Vo+, as shown.

Switching matrix 801 may include a plurality of switches that couple or decouple from each other the pillars 302 in TMR 802*a* to bring the total resistance of TMR 802*a* to a desired first value. Switching matrix 801 may further include a plurality of switches that couple or decouple from each other the pillars 302 in TMR 804*a* to bring the total resistance of TMR 804*a* to a desired second value.

Switching matrix 803 may include a plurality of switches that couple or decouple from each other the pillars 302 in TMR 806*a* to bring the total resistance of TMR 806*a* to a desired third value. Switching matrix 803 may further include a plurality of switches that couple or decouple from each other the pillars 302 in TMR 808*a* to bring the total resistance of TMR 808*a* to a desired fourth value. The total resistance of TMRs 802*a*, 804*a*, 806*a*, 808*a* may be set independently of each other by switching matrices 801 and 803, such that, at any given time, any of TMRs 802*a*, 804*a*, 806*a*, and 808*a* may have the same total resistance values or different total resistance values.

The passive resistor-based DACs 802*b*, 804*b*, 806*b*, 808*b* can be controlled by providing one or more a programmable taps with which passive resistor unit cells 810 can be brought online or offline to achieve a desired total resistance for each passive resistor. Such control of the resistance of passive resistor-based DACs 802*b*, 804*b*, 806*b*, 808*b* can be achieved under the control of a CTRL 1 signal with which taps are selectively coupled to the bridge output terminals Vo−, Vo+, as shown. In one example, as illustrated, passive resistor unit cells 810 can be brought in and out of parallel coupling in order to adjust the total resistance of the respective passive resistor DAC 802*b*, 804*b*, 806*b*, 808*b*.

Switching matrix 801 may include a plurality of switches that couple or decouple from each other the passive resistor unit cells 810 in passive resistor 802*b* to bring the total resistance of passive resistor 802*b* to a desired first value. Switching matrix 801 may further include a plurality of switches that couple or decouple from each other the passive resistor unit cells 810 in passive resistor 804*b* to bring the total resistance of passive resistor 804*b* to a desired second value.

Switching matrix 803 may include a plurality of switches that couple or decouple from each other the passive resistor unit cells 810 in passive resistor 806*b* to bring the total resistance of passive resistor 806*b* to a desired third value. Switching matrix 803 may further include a plurality of switches that couple or decouple from each other the passive resistor unit cells 810 in passive resistor 808*b* to bring the total resistance of passive resistor 808*b* to a desired fourth value. The total resistance of passive resistors 802*b*, 804*b*, 806*b*, 808*b* may be set independently of each other by switching matrices 801 and 803, such that, at any given time, any of passive resistors 802*b*, 804*b*, 806*b*, 808*b* may have the same total resistance values or different total resistance values.

Figure 9:
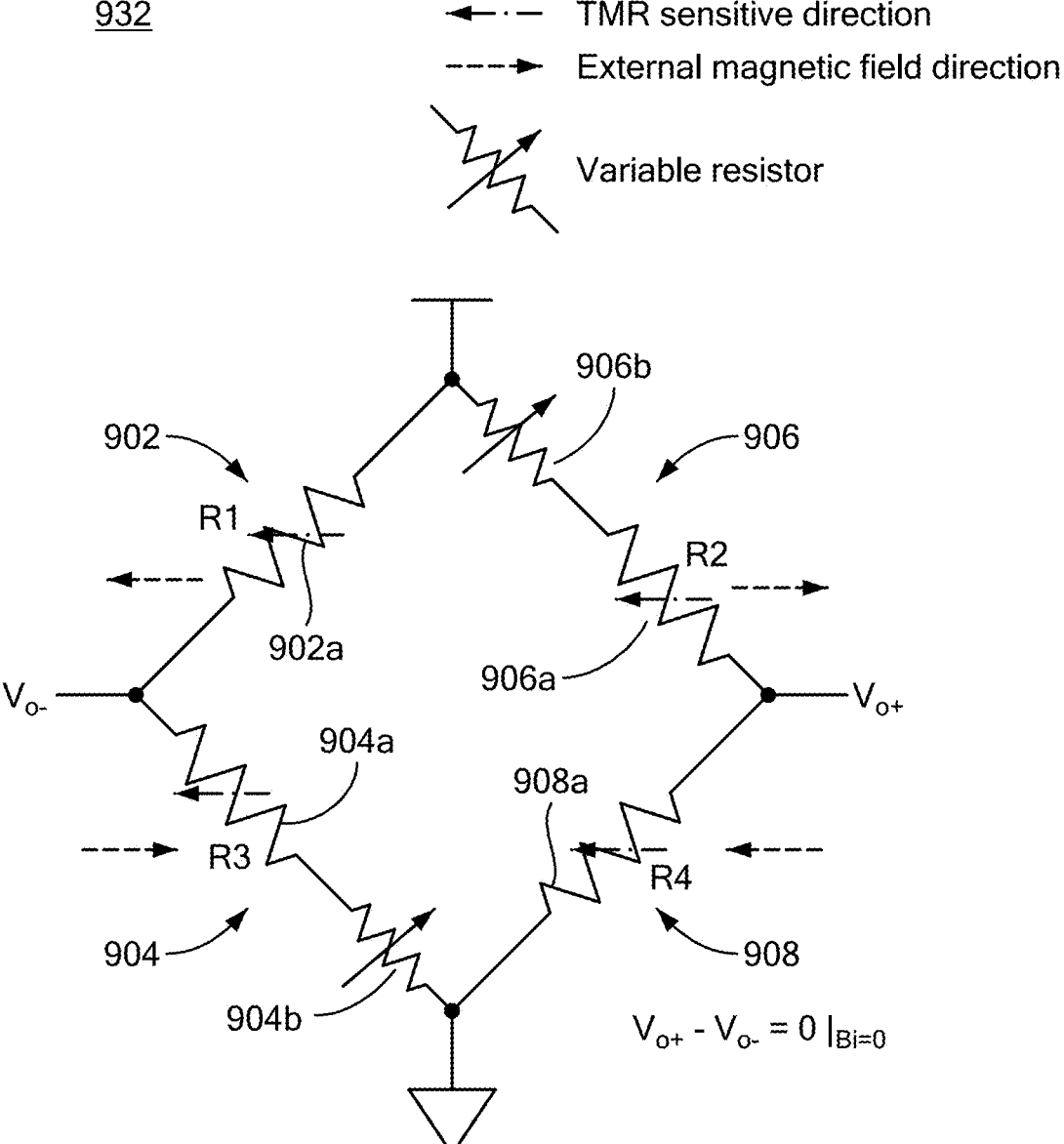
FIG. 9 is a diagram of an example sensing bridge, according to aspects of the disclosure.

Referring also to FIG. 9, a schematic representation of an example sensing bridge 932 of the general type of sensing bridge 832 (FIG. 8) includes bridge legs 902, 904, 906, 908. Each bridge leg 902, 904, 906, 908 can include one or more than one type of resistive element. Here, bridge leg 902 includes TMR R1 902*a*, bridge leg 904 includes TMR R3 904*a* and passive resistor 904*b*, bridge leg 906 includes TMR R2 906*a* and passive resistor 906*b*, and bridge leg 908 includes TMR R4 908*a*. The solid line arrows through passive resistors 904*b*, 906*b* indicate that such resistors are adjustable.

Each of the TMR elements 902*a*, 904*a*, 906*a*, and 908*a* includes a plurality of pillars or dots (see FIG. 8A) and has a respective magnetic reference, or pinning direction as indicated by a dot-dash line arrow through the element symbol. When a TMR dot is offline, the dot does not contribute to the total resistance of the TMR and when a dot is online, the dot contributes to the total resistance of the TMR.

Dotted line arrows illustrate the direction of an external applied magnetic field to be sensed. As is apparent, the external magnetic field has a first direction with respect to TMRs 904*a* and 906*a* and a second, opposite direction with respect to TMRs 902*a* and 906*a*. With this bridge configuration, the external magnetic field causes the differential output voltage of the bridge Vo+−Vo− to be proportional to the strength of the external magnetic field to be sensed. As another possible sensing bridge arrangement, two bridges electrically connected such that their output signals are subtracted in order to differentially sense a magnetic field can be used. Sensing bridge arrangements of this type are described in a co-pending U.S. patent application Ser. No. 18/070,918 entitled "Magnetoresistance Bridge Circuits with Stray Field Immunity" and filed on Nov. 29, 2022, which application is hereby incorporated herein in its entirety.

Each of the passive resistors 904*b*, 906*b* includes a plurality of passive resistor unit cells (see FIG. 8A) that may be online or offline. When a passive resistor unit cell is offline, the unit cell does not contribute to the total resistance of the passive resistor. When a passive resistor unit cell is online, the unit cell contributes to the total resistance of the passive resistor.

The sensing bridge 932 corrects resistive imbalance or mismatch amongst bridge legs 902, 904, 906, 908 using passive resistors 904*b*, 906*b* as DAC unit cells. By "DAC unit cells" it is meant that one or more passive resistors 904*b*, 906*b* can produce a quantized, discrete resistance level step under the control of an input code by which passive resistor unit cells are brought online and offline (i.e., coupled and decoupled from the respective bridge leg). Since passive resistors 904*b*, 906*b* contain multiple passive resistor unit cells, this methodology can be referred to as using passive resistor-based DACs.

Bridge 932 can be used in place of bridge 132 in FIG. 1A or 1B for example. In such an arrangement, control circuit 135 can generate a signal COUNT, as explained above in connection with FIGS. 5, 6, and 7, but for controlling the resistance of passive resistors 904*b*, 906*b* of bridge 932 by selecting the appropriate resistance for at least one of these adjustable passive resistors in the sensing bridge 832.

More particularly, matrix controller 801 can be configured to detect when a value of a counter signal is updated and cause the switching matrix to change the total resistance of the passive resistor 904*b* by coupling one or more of the plurality of passive resistor unit cells to the passive resistor 904*b* or by decoupling one or more of the plurality of passive resistor unit cells from the passive resistor 904*b* based on the value of the counter signal. Similarly, matrix controller 803 can be configured to detect when a value of a counter signal is updated and cause the switching matrix to change the total resistance of the passive resistor 906*b* by coupling one or more of the plurality of passive resistor unit cells to the passive resistor 906*b* or by decoupling one or more of the plurality of passive resistor unit cells from the passive resistor 906*b* based on the value of the counter signal.

A counter signal generator can be the same as or similar to counter 708 of FIG. 7 and can be configured to detect whether a CMRR signal indicative of the CMRR of the bridge 932 satisfies a predetermined condition and update the value of the COUNT signal in response to the CMRR signal satisfying the predetermined condition. In the context of the control circuit 135 of FIG. 7 being used to detect whether a CMRR signal satisfies a predetermined condition, each of signals 703, 705 may be referred to as a CMRR signal.

Sensing bridge 932 can be employed in a manner to achieve a zero differential output voltage of the bridge when the external magnetic field is zero in either a static manner or in a dynamic manner. Static operation of can be achieved by implementing a one-time evaluation of the differential output voltage without any external magnetic field applied and zeroing the differential output voltage based on selection of online and offline passive resistor unit cells of passive resistors 904*b*, 906*b*.

It will be appreciated by those of ordinary skill in the art that bridge legs 902, 904, 906, 908 can be varied in their components and couplings while still achieving the described benefits. For example, while passive resistors 904*b*, 906*b* are shown to be coupled in series with respective TMRs 904*a*, 906*a*, such passive resistors could instead be coupled in parallel with the respective TMRs. Further, although each bridge leg 902, 904, 906, 908 is shown to include respective elements coupled in series (e.g., TMR 904*a* and resistor 904*b* are shown to be coupled in series), it will be appreciated by those of ordinary skill in the art that elements within each bridge leg may instead be coupled in parallel.

Figure 10:
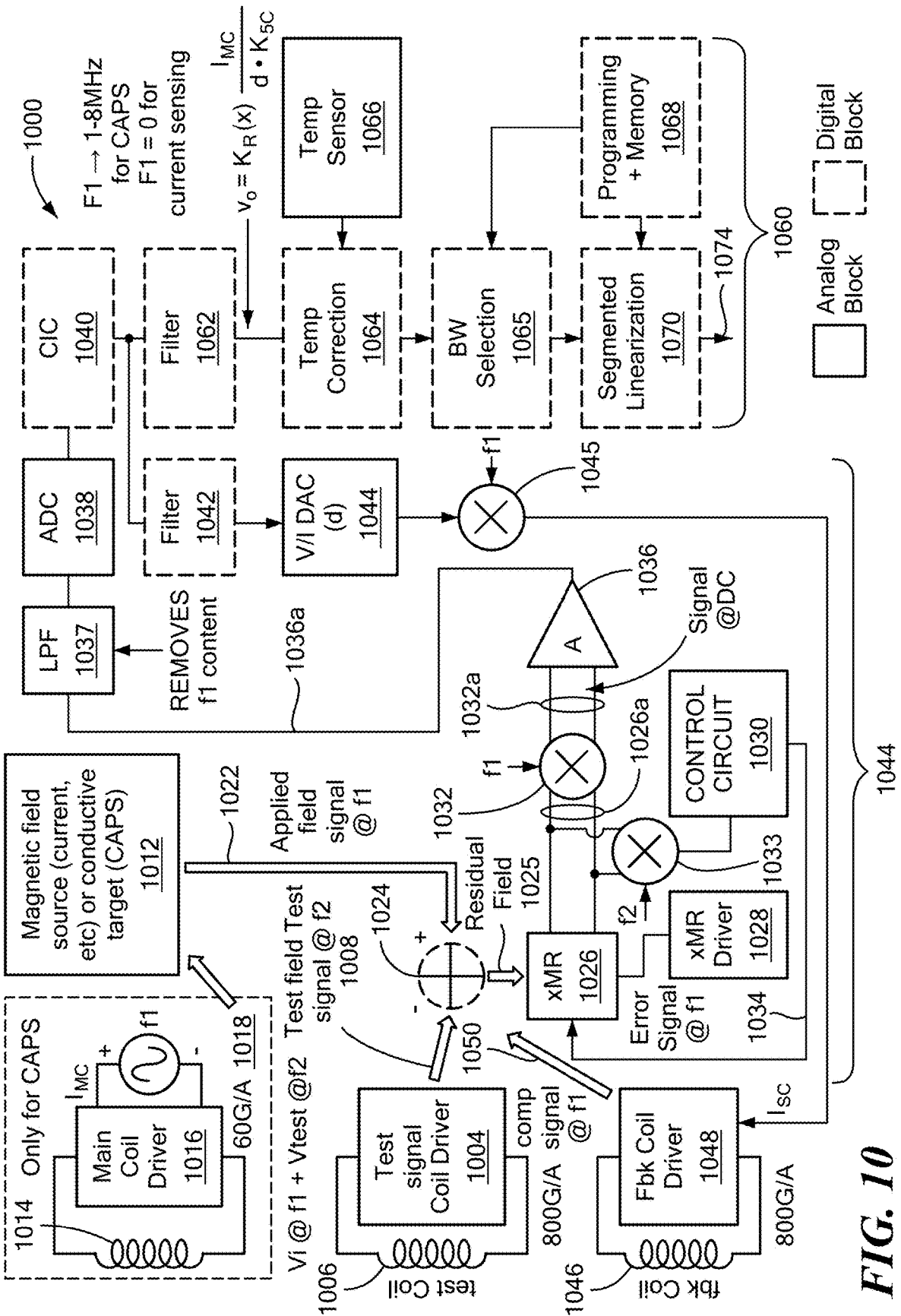
FIG. 10 is a diagram of an example of a sensor, according to aspects of the disclosure.

Referring to FIG. 10, a sensor 1000 includes additional features to improve CMRR performance by providing a local common mode test magnetic field 1008 in order to correct for sensitivity mismatches amongst legs of the sensing bridge 1026 which sensitivity mismatches are attributable to one or both of electrical imbalance (i.e., offset) and inherent magnetic response mismatch of the TMRs. For this reason, the sensor arrangement of FIG. 10 with test magnetic field 1208 can be referred to as a "Common Mode Rejection Ratio, or CMRR DAC."

Test magnetic field generation circuitry includes a test signal coil driver 1004 coupled to a test coil 2006. The generated common mode test magnetic field 1008 mimics a common mode stray field and can have a frequency f2. Thus, frequency f2 is selected to be in the same band as potential external source of stray fields and out of the frequency band of the external field of interest corresponding to frequency f1.

Sensor 1000 includes magnetoresistance circuitry 1026 having multiple magnetoresistance elements, e.g., four elements, in a bridge configuration. Magnetoresistance circuitry 1026 can be driven by a magnetoresistance driver 1028.

Figure 11:
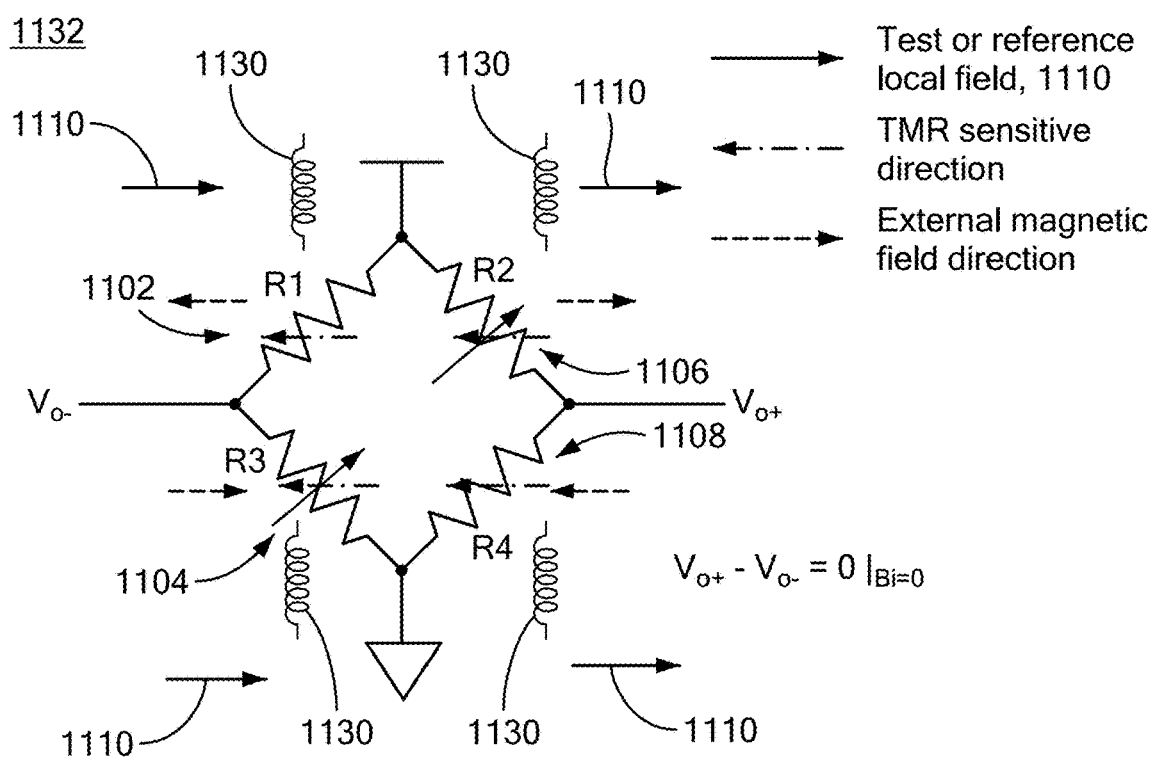
FIG. 11 is a diagram of an example sensing bridge, according to aspects of the disclosure.

Example sensing bridges for providing the magnetoresistance circuitry 1026 of FIG. 10 and illustrating application of test field 1008 are shown in FIGS. 11 and 12. Suffice it to say here that sensing bridge 1026 can include one or more dot-based DACs by which one or more TMR elements have their total resistance adjusted by controlled, selective coupling and decoupling of dots (see FIG. 11) and/or can include one or more passive resistor-based DACs by which one or more passive resistors have their total resistance adjusted by controlled, selective coupling and decoupling of passive resistor unit cells (see FIG. 12).

In general, having applied a local test field 1008, the differential output of the sensing bridge 1026 is monitored for components at frequency f2 and if the resulting differential output signal is zero, then the bridge is considered to be sensitivity matched, whereas if there is a non-zero differential output signal at frequency f2, then there is determined to be a sensitivity mismatch.

Having determined that there is a sensitivity mismatch, the effects of the mismatch can be eliminated in a static manner (i.e., by trimming of one or more of the bridge elements) or in a dynamic fashion. To this end, a control circuit 1030 is provided.

The magnetic field sought to be detected by sensor 1000 is referred to generally as the applied magnetic field 1022. Depending on the sensor application, the applied magnetic field 1022 can be generated by a target 1012 that can be a magnetic field source or that can be a conductive target configured to reflect a magnetic field generated by another source. Thus, the term "target" is used generally to describe an object or portion of an object to be sensed or detected. The target may include a conductive material that allows for eddy currents to flow within the target.

For embodiments sensing a magnetic field reflected from a conductive target, the sensed magnetic field can result from a main coil magnetic field that is generated by a main coil 1014 as part of main coil circuitry 1018 including a main coil driver 1016. In example embodiments, the target 1012 may include, but is not limited to, a portion of a moving metal machine component such as a gear tooth, a camshaft lobe, a magnetic domain on a rotating shaft, or a magnetic domain on a rotating/moving element, etc. For embodiments sensing a reflected magnetic field reflected from target 1012, the reflected magnetic field allows measurement of a position of the target. In such embodiments, the applied magnetic field 1022 can include a signal having a relatively high frequency f1 that is indicative of a signal of interest for processing by a main signal path 1060 to generate an output signal 1074 of the sensor 1000.

Magnetic field sensor 1000 can, optionally, include a magnetic closed loop (i.e., feedback loop) including feedback circuitry 1044 and feedback coil circuitry 1046, 1048 that generates a feedback magnetic field 1050. To this end, the applied field 1022 can be amplified and fed back to the magnetic field sensing elements 1026 by feedback coil 1046 such that the magnetic field sensing elements operate in a linear range.

The feedback circuitry 1044 can be an analog circuitry (similar to FIG. 1B) or digital circuitry as illustrated in FIG. 10. It will be appreciated by those of ordinary skill in the art that, in the case of an analog feedback circuit, the feedback circuitry 1044 can be coupled to the output of low pass filter 1037 rather than to the output of the ADC 1038 as shown.

The magnetoresistance circuitry 1026 is configured to sense one or more magnetic fields, including a residual magnetic field (i.e., a resultant or error magnetic field) resulting from a combination of the applied magnetic field 1022 at a first frequency f1 and the feedback magnetic field 1050 in embodiments including a magnetic closed loop. Alternatively, in embodiments that do not include a magnetic closed loop, magnetoresistance circuitry 1026 is configured to sense the applied magnetic field 1022 at the first frequency f1.

Main signal circuitry 1060 can process a main signal from the magnetoresistance circuitry 1026 in order to generate a sensor output signal 1074 that can be indicative of the position and/or motion of the magnetic source, or target 1012.

The magnetoresistance circuitry 1026 is configured to receive or detect a residual magnetic field 1025 resulting from a combination of applied magnetic field 1022, feedback magnetic field 1050 (in embodiments with a closed magnetic loop) and test magnetic field 1008 and to produce a corresponding electrical output signal 1026a, e.g., as a differential output voltage signal. Applied magnetic field 1022, feedback magnetic field 1050, and test magnetic field 1008, are indicated as being combined by summation unit 1024, however an electronic summation unit 1024 is not necessary for combination of the magnetic fields 1022, 1008, 1050 as they may be combined (e.g., be superposed) in any medium or in free space. For example, placement and/or geometry of sensing elements of magnetoresistance circuitry 1026 with respect to the magnetic source 1012, test coil 1006, and feedback coil 1046 can result in generation of the residual magnetic field 1025 as the difference between the fields 1022, 1008, and 1050. It will be appreciated that only the portion of the test field 1008 that is converted to differential mode due to the CMRR is combined with the other fields 1022, 1050.

The feedback magnetic field 1050 generated by the feedback coil 1046 can be used, in example embodiments, to reduce or attenuate the residual magnetic field 1025 such that the magnetoresistance circuitry 1026 is operational in a linear region of the transfer function curve of the magnetoresistance elements. In example embodiments, the feedback magnetic field 1050 can include a scaled replica of the applied magnetic field 1022. Use of the feedback magnetic field 1050 can accordingly allow the magnetoresistance circuitry 1026 to be used in a linear range of operation and mitigate negative effects arising from undesirable signal components, for example, stray magnetic fields or by temperature or mechanical stresses that may be included in the applied magnetic field 1022.

Output signal 1026a of the MR elements 1026 can contain high frequency components of interest (i.e., components corresponding to the useful signal to be sensed) at the first frequency f1, test signal components at the second frequency f2, and undesirable offset components at baseband as may be attributable to offset of the sensing bridge 1026.

In embodiments that sense a reflected magnetic field reflected from target 1012, in which case the applied magnetic field 1022 can include a signal having a relatively high frequency f1 that is indicative of a signal of interest, a modulator 1032 is configured to shift the frequency of the received signal 1026a so that an output signal 1032a of the modulator 1032 includes a baseband portion indicative of a useful signal of interest (referred to herein as a main signal portion) and any undesirable offset component at frequency f1. With other types of external magnetic sources 1012, modulator 1032 can be omitted.

Amplifier 1036 is coupled to receive the modulator output signal 1032a and amplify the signal in order to generate a superimposed signal 1036a containing a main signal portion of interest at DC and any undesirable offset signal portion at frequency f1. A low pass filter 1037 can be configured to remove the undesirable signal portion at frequency f1.

The superimposed signal 1036a can be provided to feedback circuitry to drive feedback coil 1046 and generate the feedback magnetic field 1050. For example, the superimposed signal 1036a can be filtered by a filter 1042 and converted from a voltage to a current by a transconductance amplifier 1044. Ideally the superimposed signal 1036a at the output of amplifier 1036 contains only the main signal of interest at baseband and little to no high frequency components representing offset components; however, in the event that such high frequency undesirable components remain in signal 1036a, they can be removed by low pass filter 1042 for example.

A second modulator 1045 can be coupled to receive the output current signal from the transconductance amplifier 1044 and generate a feedback signal Isc for coupling to the feedback coil driver 1048. Feedback coil driver 1048 can generate the drive signal for the feedback coil 1046 to generate the feedback magnetic field 1050 based on the feedback signal.

The superimposed signal 1036a can also be provided to main signal path 1060 for extracting the main signal portion or component and producing an output signal 1074 of the magnetic field sensor 1000. The signal 1036a may be provided to an analog-to-digital converter 1038 to convert the signal 1036a from an analog signal to a digital signal. One or more filters, e.g., cascaded integrator-comb (CIC) filter 1040 and/or digital filter 1062, may be included for filtering, as low pass filters to remove high frequency components.

Main signal path 1060 can include a temperature correction circuit 1064, a temperature sensor 1066, a programming and memory circuit 1068, a bandwidth selection block 1065, and a segmented linearization block 1070, providing main signal output 1074. Temperature correction block 1064 may scale the output voltage signal according to temperature, e.g., a temperature measured by the temperature sensor 1066. Main signal path 1060 can provide main signal output 1074, which in example embodiments may be indicative of an angle or position or other parameter associated with the source, or target 1012.

As noted above, the differential output of bridge 1026 at test field frequency f2 is evaluated and any necessary corrections made in order to resolve any bridge sensitivity mismatches. To this end, a modulator 1033 is coupled to receive the differential output signal 1026a of bridge 1026 in order to thereby shift the frequency of the sensed test field 1008 from frequency f2 to baseband.

A control circuit 1030 coupled to an output of modulator 1033 is configured to compare the modulator output signal to a reference, such as zero. The reference is indicative of the desired value to which the autozero control circuit 1030 sets the differential bridge output at frequency f2. To this end, control circuit 1030 can be the same as or similar to autozero control circuit 135 of FIG. 7.

More particularly, in the case of bridge 1026 including one or more adjustable TMRs, a counter signal generator (that can be the same as or similar to counter 708 of FIG. 7) can detect whether an offset signal indicative of the offset of bridge 1026 satisfies a predetermined condition and update the value of the COUNT signal in response to the offset signal satisfying the predetermined condition. In the case of bridge 1026 including one or more adjustable passive resistors, a counter signal generator (that can be the same as or similar to counter 708 of FIG. 7) can detect whether a CMRR signal indicative of the CMRR of bridge 1026 satisfies a predetermined condition and update the value of the COUNT signal in response to the CMRR signal satisfying the predetermined condition. In the context of the control circuit 135 of FIG. 7 being used to detect whether a CMRR signal satisfies a predetermined condition, each of signals 703, 705 may be referred to as a CMRR signal.

With this arrangement of generating a test field 1008 and processing its effect on bridge 1026, sensitivity mismatches are resolved and CMRR performance is thereby improved.

Referring to FIG. 11, a schematic representation of an example sensing bridge 1132 of the general type of sensing bridge 1026 for use in the sensor 1000 of FIG. 10 includes bridge legs 1102, 1104, 1106, 1108. Bridge legs 1104, 1106 can include TMRs R3, R2, respectively, that can have adjustable resistances by bringing dots of the respective TMR online and offline as represented by solid line arrows through such element symbols, whereas bridge legs 1102, 1108 can include TMRs R1, R4 having fixed resistances. The term "fixed resistances" as used herein mean that the TMRs R1, R4 do not have an adjustable total resistance by selectively coupling and decoupling dots, however it will be understood that by nature of TMRs generally, the resistance of TMRs R1, R4 can vary based on magnetic field effects.

Each of the TMR elements R1, R2, R3, R4 has a respective magnetic reference, or pinning direction as indicated by a dot-dash line arrow through the element symbols. Dotted line arrows adjacent to the TMRs R1, R2, R3, R4 illustrate the direction of an external magnetic field to be sensed. As is apparent, the external magnetic field has a first direction with respect to TMRs R2, R3 and a second, opposite direction with respect to TMRs R1, R4. With this bridge configuration, the external magnetic field causes a bridge output signal Vo+−Vo− to be proportional to the field strength.

The sensing bridge 1132 is used to correct resistive imbalance or mismatch amongst bridge legs 1102, 1104, 1106, 1108 by using such TMRs R2 and R3 as DAC unit cells, or dot-based DACs.

Local test magnetic field 1110, that may be the same as or similar to test field 1008, is generated by test coils 1130, placed in proximity to each of the TMR elements R1, R2, R3, R4, as shown. As noted above, test magnetic field 1110 mimics a stray magnetic field and thus, presents a uniform field at each of the TMR elements R1, R2, R3, R4.

It will be appreciated that although the adjustable elements of bridge 1132 are illustrated as being TMRs R2, R3, TMRs R1, R4 could additionally or alternatively be adjustable by bringing dots online and offline. Most generally, any one or more of the TMR R1, R2, R3, R4 are adjustable.

Referring also to FIG. 12, a schematic representation of another example sensing bridge 1232 of the general type of sensing bridge 1226 for use in the sensor 1000 of FIG. 10 includes bridge legs 1202, 1204, 1206, 1208. Each of the bridge legs 1202, 1204, 1206, 1208 can include a respective TMR R1, R3, R2, R4. In an example, TMRs R1, R2, R3, R4 can have fixed resistances in the sense that they do not have an adjustable total resistance by selectively coupling and decoupling dots.

Bridge legs 1204, 1206 can each additionally include an adjustable passive resistor 1214, 1216, respectively, as represented by solid line arrows through such elements. Passive resistors 1214, 1216 can be adjustable by bringing unit cells of each such passive resistor online and offline.

Like with the example bridge 1132 of FIG. 11, each of the TMR elements R1, R2, R3, R4 has a respective magnetic reference, or pinning direction as indicated by a dot-dash line arrow through the element symbol. Dotted line arrows adjacent to the TMRs R1, R2, R3, R4 illustrate the direction of an external magnetic field to be sensed. As is apparent, the external magnetic field has a first direction with respect to TMRs R2, R3 and a second, opposite direction with respect to TMRs R1, R4. With this bridge configuration, the external magnetic field causes a bridge output signal Vo+−Vo− to be proportional to the field strength.

The sensing bridge 1232 is used to correct sensitivity mismatch amongst bridge legs 1102, 1104, 1106, 1108 by using passive resistors 1214, 1216 as DAC unit cells, or passive resistor-based DACs.

Local test magnetic field 1210, that may be the same as or similar to test field 1008, is generated by test coils 1230, placed in proximity to each of the TMR elements R1, R2, R3, R4, as shown. As noted above, test magnetic field 1210 mimics a stray magnetic field and thus, presents a uniform field at each of the TMR elements R1, R2, R3, R4.

It will be appreciated that although the adjustable elements of bridge 1232 are illustrated as being passive resistors 1214, 1216, other elements of the bridge (namely one or more TMR elements R1, R2, R3, R4) could also be adjustable, in the case of TMRs, by bringing dots online and offline.

In some applications, it may be desirable to address both DC offset with one or more dot-based DACs embedded in the sensing bridge and also address CMRR degradation with one or more passive resistor-based DACs embedded in the sensing bridge.

Referring also to FIG. 13, an example bridge 1332 includes both variable passive resistors to implement passive resistor-based DACs and variable TMRs to implement dot-based DACS. As will become apparent, bridge 1332 is a type of sensing bridge 1226 for use in a sensor 1400 described below in connection with FIG. 14.

Bridge 1332 includes bridge legs 1302, 1304, 1306, 1308. Each of the bridge legs 1302, 1304, 1306, 1308 can include a respective TMR R1, R3, R2, R4. In an example, TMRs R2, R3, can have fixed resistances and TMRs R1, R4 can be variable as indicated by solid line arrows through such element symbols. Together adjustable TMRs R1, R4 provide a dot-based DAC labeled 1340.

Bridge legs 1304, 1306 can each additionally include an adjustable passive resistor 1314, 1316, respectively, as represented by solid line arrows through such element symbols. Passive resistors 1314, 1316 can be adjustable by bringing unit cells of each such passive resistor online and offline. Together adjustable passive resistors 1314, 1316 provide a passive resistor-based DAC labeled 1344.

Each of the TMR elements R1, R2, R3, R4 has a respective magnetic reference, or pinning direction as indicated by a dot-dash line arrow through the element symbol. Dotted line arrows adjacent to the TMRs R1, R2, R3, R4 illustrate the direction of an external magnetic field to be sensed. As is apparent, the external magnetic field has a first direction with respect to TMRs R2, R3 and a second, opposite direction with respect to TMRs R1, R4. With this bridge configuration, the external magnetic field causes a bridge output signal Vo+−Vo− to be proportional to the field strength.

The sensing bridge 1332 is used to correct resistive imbalance or mismatch amongst bridge legs 1102, 1104, 1106, 1108 by using TMRs R1, R4 as dot-based DAC 1340 and to correct CMRR degradation created by electrical imbalance and sensitivity mismatch amongst the bridge legs by using passive resistors 1314, 1316 as passive resistor-based DAC 1344.

Figure 14:
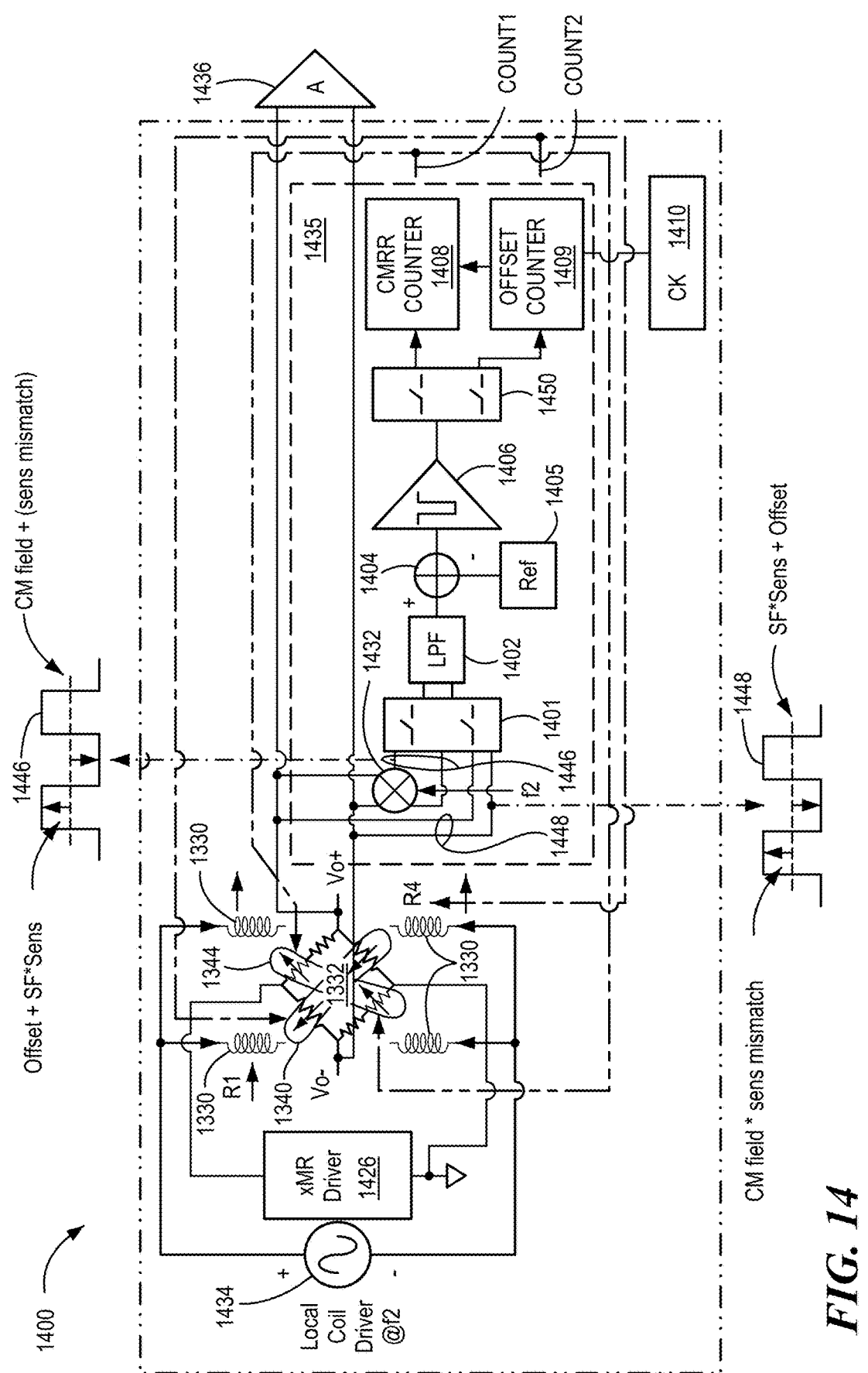
FIG. 14 is a diagram of an example of a sensor, according to aspects of the disclosure.

Referring to FIG. 14, a simplified view of a sensor 1400 can include sensing bridge 1332 (FIG. 13) and an autozero circuit 1435 having feedback loops configured to control a respective one of the DACs 1340, 1344. Magnetoresistance circuitry in the form of sensing bridge 1332 can be driven by a magnetoresistance driver 1426.

Sensor 1400 includes test magnetic signal generation circuitry including a local coil driver 1434 coupled to a test coils 1330, each positioned in proximity to a leg of sensing bridge 1332. The generated test magnetic reference field mimics a common mode stray field and can have a frequency f2. Thus, frequency f2 is selected to be in the same band as potential external stray fields and out of the frequency band of the external field of interest corresponding to frequency f1.

Features of sensor 1400 not shown in the simplified view of FIG. 14 are shown in sensor 1000 of FIG. 14 including, but not limited to feedback circuitry 1044, feedback magnetic field 1050, target 1012, and main coil circuitry 1018.

Autozero circuit 1435 has a first feedback loop configured to control the dot-based DAC 1340 and thus, that can be referred to as a DC offset loop and a second feedback loop configured to control the passive resistor-based DAC 1344 and thus, that can be referred to as a CMRR loop. The CMRR loop includes a CMRR counter 1408 configured to generate a COUNT1 signal indicative of any sensitivity mismatch in the bridge 1332 and the DC offset loop includes an offset counter 1409 configured to generate a COUNT2 signal indicative of any offset in the bridge.

A multiplexer 1401 is provided to permit sharing of components of the DC offset and CMRR feedback loops. To this end, a differential DC output connection 1448 of bridge 1332 is coupled to inputs of multiplexer 1401 and a differential output of a modulator 1432 is also coupled to inputs of multiplexer 1401, as shown.

The differential bridge output 1448 is equal to the common mode field generated by the test signal at frequency f2 multiplied by the sensitivity mismatch, this signal having a frequency content around f2 superimposed to another signal resulting from the stray field multiplied by the sensitivity mismatch plus the offset, these two signals having a frequency content around DC. Bridge output 1448 is additionally coupled to an amplifier 1436 that may be the same as or similar to amplifier 1036 of FIG. 10.

Modulator 1432 is coupled to the differential output of bridge 1332 and is configured to convert the component of the bridge output signal at frequency f2 to baseband. Thus, the output 1446 of modulator 1432 is equal to the offset plus the stray field multiplied by the sensitivity mismatch, these two signals having frequency components centered around f2 and superimposed to a DC level given by the common mode field multiplied by the sensitivity mismatch of the bridge, this signal having a frequency content around DC.

Multiplexer 1401 is controlled to couple either the output 1446 of modulator 1432 or the DC output 1448 of bridge 1332 to a low pass filter 1402 and the filter output is compared, by a comparator 1406, to a reference 1405. An optional element 1404 (that can be considered part of comparator 1406) can subtract a known reference from the output of the low pass filter 1402 such that the comparator 1406 trips around zero. If optional element 1404 is not used, then the comparator 1406 has another input providing a reference. It will be appreciated that although reference 1405 is generally zero since that is generally the desired output in the presence of the reference common field, other reference voltages are possible.

If the baseband signal representing the test magnetic field 1446 is equal to zero (or more generally is equal to reference 1405), then the sensitivity of bridge 1332 can be considered to be matched, whereas if there is a non-zero baseband signal representing the test field, then a COUNT1 signal can generate a code to adjust the resistance of passive resistor-based DAC 1344. If the differential signal 1448 is equal to zero, then the offset of bridge 1332 can be considered to be zero, whereas if there is a non-zero signal 1446, then a COUNT2 signal can generate a code to adjust the resistance of dot-based DAC 1340.

The output of comparator 1406 is coupled to a demultiplexer 1450 that is commonly controlled with multiplexer 1401 so that at any given time, either test field signal 1446 or DC offset signal 1448 is processed by autozero circuit 1435.

It will be appreciated by those of ordinary skill in the art that, in embodiments in which only offset is desired to be addressed, the CMRR loop including CMRR counter 1408 can be omitted and, in embodiments in which only CMRR is desired to be addressed, the offset loop including offset counter 1409 can be omitted and if only one such loop is provided, multiplexer 1401 and demultiplexer 1450 can be omitted.

A magnetic-field sensing element can be, but is not limited to, a Hall Effect element a magnetoresistance element, or an inductive coil. As is known, there are different types of Hall Effect elements, for example, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). The phrase "set of magnetic field elements" shall mean "one or more magnetic field sensing elements". For example, and without limitation, described sensing elements may include any of the listed magnetic field sensing element types. As used throughout the disclosure, the phrase "current value of signal COUNT" refers to the instant or present value of signal COUNT, rather than a current level.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special-purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., an addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A system, comprising:

a sensing element including a first element of a first element type that is responsive to a magnetic field and a second element of a second element type that is not responsive to the magnetic field, wherein the second element is coupled to the first element and includes a plurality of passive resistor unit cells;

a switching matrix that is configured to change a total resistance of the sensing element by coupling one or more of the plurality of passive resistor unit cells to the sensing element or by decoupling one or more of the plurality of passive resistor unit cells from the sensing element; and a matrix controller that is configured to cause the switching matrix to change the total resistance of the sensing element by coupling or decoupling one or more of the plurality of passive resistor unit cells.

2. The system of claim 1, wherein the first element type is a tunneling magnetoresistance element (TMR) comprising a plurality of dots.

3. The system of claim 1, wherein the sensing element is part of a sensing bridge.

4. The system of claim 1, wherein:
the switching matrix includes a plurality of switches, each arranged to bypass one or more of the plurality of passive resistor unit cells; and
the matrix controller includes electronic circuitry that is configured to independently turn on and off each of the plurality of switches.

5. The system of claim 1, wherein the matrix controller is configured to detect when a value of a counter signal is updated and cause the switching matrix to change the total resistance of the sensing element based on the value of the counter signal; and
a counter signal generator configured to detect whether a CMRR signal representative of the CMRR of the sensing element satisfies a predetermined condition and update the value of the counter signal in response to the CMRR signal satisfying the predetermined condition.

6. The system of claim 5, wherein the CMRR signal is generated based on a sensing signal that is at least in part generated by the sensing element, the sensing element is part of a sensing bridge and the sensing signal is a differential signal that is output by the sensing bridge.

7. The system of claim 6, wherein the counter signal generator includes a low-pass filter, a counter, and a comparator that is configured to supply an enable signal to the counter, the low-pass filter being configured to generate the CMRR signal by filtering the sensing signal, the comparator being configured to set the enable signal to a predetermined value when the CMRR signal is outside of predetermined bounds, the value of the counter signal being updated when the enable signal is set to the predetermined value.

8. The system of claim 1, wherein the sensing element is configured to receive a residual magnetic field including a difference between an applied magnetic field produced by a source at a first frequency and a feedback magnetic field and produce a superimposed signal comprising a main signal portion;
feedback coil circuitry coupled to receive the superimposed signal and including a feedback coil configured to generate the feedback magnetic field; and
main processing circuitry operative to extract the main signal portion from the superimposed signal and produce a sensor output signal based on the main signal portion, wherein the main signal portion is indicative of a physical parameter associated with the source.

9. A magnetic field sensor comprising:
a sensing bridge including a sensing element configured to receive an applied magnetic field at a first frequency, wherein the sensing element includes one or both of a magnetoresistance element that is responsive to the applied magnetic field and that includes a plurality of dots and a passive resistor that is not responsive to the applied magnetic field and that includes a plurality of passive resistor unit cells;
test signal generation circuitry configured to generate a common mode test magnetic field at a second frequency and combine the common mode test magnetic field with the applied magnetic field to generate a combined signal comprising a main signal portion;
main processing circuitry configured to extract the main signal portion from the combined signal and produce a sensor output signal based on the main signal portion; and
test signal processing circuitry configured to monitor a differential output of the sensing bridge at the second frequency to determine a sensitivity mismatch of the sensing bridge.

10. The magnetic field sensor of claim 9, further comprising:
a switching matrix that is configured to change a total resistance of the sensing element by coupling one or more of the plurality of dots to the sensing element or by decoupling one or more of the plurality of dots from the sensing element; and
a matrix controller that is configured to cause the switching matrix to change the total resistance of the sensing element by coupling or decoupling one or more of the plurality of dots.

11. The magnetic field sensor of claim 10, wherein the matrix controller is configured to detect when a value of a counter signal is updated and cause the switching matrix to change the total resistance of the sensing element based on the value of the counter signal; and
a counter signal generator configured to detect whether a signal representative of an offset of the sensing bridge satisfies a predetermined condition and update the value of the counter signal in response to the signal representative of the offset satisfying the predetermined condition.

12. The magnetic field sensor of claim 11 wherein the predetermined condition is satisfied when the offset of the sensing bridge is outside of predetermined bounds.

13. The magnetic field sensor of claim 9, further comprising:
a switching matrix that is configured to change a total resistance of the sensing element by coupling one or more of the plurality of passive resistor unit cells to the sensing element or by decoupling one or more of the plurality of passive resistor unit cells from the sensing element; and
a matrix controller that is configured to cause the switching matrix to change the total resistance of the sensing element by coupling or decoupling one or more of the plurality of passive resistor unit cells.

14. The magnetic field sensor of claim 13, wherein the matrix controller is configured to detect when a value of a counter signal is updated and cause the switching matrix to change the total resistance of the sensing element based on the value of the counter signal; and
a counter signal generator configured to detect whether a signal representative of the CMRR of the sensing bridge satisfies a predetermined condition and update the value of the counter signal in response to the signal representative of the CMRR satisfying the predetermined condition.

15. The magnetic field sensor of claim 14 wherein the predetermined condition is satisfied when the CMRR of the sensing bridge is outside of predetermined bounds.

16. A magnetic field sensor comprising:
a sensing bridge including a sensing element configured to receive an applied magnetic field at a first frequency, wherein the sensing element includes a magnetoresistance element that is responsive to the applied magnetic field and that includes a plurality of dots and a passive resistor that is not responsive to the applied magnetic field and that includes a plurality of passive resistor unit cells;

test signal generation circuitry configured to generate a common mode test magnetic field at a second frequency and combine the common mode test magnetic field with the applied magnetic field to generate a combined signal comprising a main signal portion;

main processing circuitry configured to extract the main signal portion from the combined signal and produce a sensor output signal based on the main signal portion; and test signal processing circuitry configured to monitor a differential output of the sensing bridge at the first frequency to determine an offset mismatch of the sensing bridge and to monitor the differential output of the sensing bridge at the second frequency to determine a CMRR of the sensing bridge.

17. The magnetic field sensor of claim 16, further comprising:

a first switching matrix that is configured to change a total resistance of the sensing element by coupling one or more of the plurality of passive resistor unit cells to the sensing element or by decoupling one or more of the plurality of passive resistor unit cells from the sensing element;

a second switching matrix that is configured to change a total resistance of the sensing element by coupling one or more of the plurality of dots to the sensing element or by decoupling one or more of the plurality of dots from the sensing element; and a matrix controller that is configured to cause the first switching matrix and the second switching matrix to change the total resistance of the sensing element.

18. The magnetic field sensor of claim 17, wherein:

the first switching matrix includes a first plurality of switches, each arranged to bypass one or more of the plurality of passive resistor unit cells;

the second switching matrix includes a second plurality of switches, each arranged to bypass one or more of the plurality of dots; and the matrix controller includes electronic circuitry that is configured to independently turn on and off each of the first plurality of switches and the second plurality of switches.

19. The magnetic field sensor of claim 17, wherein the matrix controller is configured to detect the CMRR of the sensing bridge and cause the first switching matrix to change the total resistance of the sensing element if the detected CMRR satisfies a first predetermined condition and to detect an offset of the sensing bridge and cause the second switching matrix to change the total resistance of the sensing element if the detected offset satisfies a second predetermined condition.

\* \* \* \* \*